(12) United States Patent
Rhodes et al.

(10) Patent No.: US 7,422,836 B2
(45) Date of Patent: Sep. 9, 2008

(54) DISSOLUTION RATE MODIFIERS FOR PHOTORESIST COMPOSITIONS

(75) Inventors: Larry F. Rhodes, Silver Lake, OH (US); Lawrence Seger, Gates Mills, OH (US); Brian L. Goodall, Ambler, PA (US); Lester H. McIntosh, III, Green Lane, PA (US); Robert J. Duff, Maple Heights, OH (US)

(73) Assignee: Promerus LLC, Brecksville, OH (US)

( * ) Notice: Subject to any disclaimer, the term of this patent is extended or adjusted under 35 U.S.C. 154(b) by 352 days.

(21) Appl. No.: 10/783,386

(22) Filed: Feb. 20, 2004

(65) Prior Publication Data

US 2004/0219452 A1 Nov. 4, 2004

Related U.S. Application Data

(60) Provisional application No. 60/448,612, filed on Feb. 20, 2003, provisional application No. 60/512,126, filed on Oct. 17, 2003.

(51) Int. Cl.
*G03F 7/00* (2006.01)
*G03F 7/004* (2006.01)
*C08F 136/00* (2006.01)

(52) U.S. Cl. ............... 430/270.1; 526/280; 526/281

(58) Field of Classification Search .............. 430/270.1; 526/280, 281
See application file for complete search history.

(56) References Cited

U.S. PATENT DOCUMENTS

| | | | |
|---|---|---|---|
| 4,250,053 A | 2/1981 | Smith | |
| 4,371,605 A | 2/1983 | Renner | |
| 4,491,628 A | 1/1985 | Ito et al. | |
| 5,372,912 A | 12/1994 | Allen et al. | |
| 5,468,819 A | 11/1995 | Goodall et al. | |
| 5,843,624 A | 12/1998 | Houlihan et al. | |
| 6,121,340 A | 9/2000 | Shick et al. | |
| 6,124,074 A | 9/2000 | Varanasi et al. | |
| 6,136,499 A | 10/2000 | Goodall et al. | |
| 6,455,650 B1 | 9/2002 | Lipian et al. | |
| 6,512,060 B1* | 1/2003 | Matyjaszewski et al. | .... 526/111 |
| 6,908,724 B2* | 6/2005 | Araki et al. | .............. 430/270.1 |
| 6,974,657 B2 | 12/2005 | Berger et al. | |

(Continued)

FOREIGN PATENT DOCUMENTS

EP 1126322 8/2001

(Continued)

OTHER PUBLICATIONS

Applicant's "Exhibit C" part of paper No. Dec. 8, 2006 (was not scanned in with the rest of the response).*

(Continued)

*Primary Examiner*—Amanda C. Walke
(74) *Attorney, Agent, or Firm*—The Webb Law Firm

(57) ABSTRACT

Oligomers of polycyclic olefin monomers, and optionally allylic or olefinic monomers, and a method of making such oligomers that includes reacting polycyclic olefin monomers in the presence of a Ni or Pd containing catalyst, or in the case of allylic monomers in the presence of a free radical initiator. The oligomers can be included in photoresist compositions as dissolution rate modifiers. The photoresist compositions can further include a polymeric binder resin, a photoacid generator, and solvents.

5 Claims, 16 Drawing Sheets

U.S. PATENT DOCUMENTS

| | | | |
|---|---|---|---|
| 2001/0033989 A1 | 10/2001 | Harada et al. | |
| 2002/0102490 A1 | 8/2002 | Ito et al. | |
| 2002/0177067 A1 | 11/2002 | Kim | |
| 2004/0091813 A1* | 5/2004 | Poss et al. | 430/270.1 |
| 2004/0265738 A1* | 12/2004 | Feiring et al. | 430/270.1 |

FOREIGN PATENT DOCUMENTS

| | | |
|---|---|---|
| EP | 1275666 | 1/2003 |
| WO | 0067072 | 11/2000 |
| WO | 0233489 | 4/2002 |

OTHER PUBLICATIONS

Jeffrey et al., "Metal complexes of hemilabile ligands. Reactivity and structure of dichlorobis(o-(diphenylphosphino)anisole)ruthenium(II)," *Inorg. Chem.*, 1979, pp. 2658-2666, vol. 18, No. 10.

Bader et al., "Coordination chemistry and catalysis with hemilabile oxygen-phosphorus ligands," *Coord. Chem. Rev.*, 1991, pp. 27-110, vol. 108.

Slone et al., "The Transition Metal Coordination Chemistry of Hemilabile Ligands," *Prog. Inorg. Chem.*, 1999, pp. 233-350, vol. 48.

Reichmanis et al., "Chemical Amplification Mechanisms for Microlithography," *Chem. Mater.*, 1991, pp. 394-407, vol. 3.

Hamad et al., "Fluorinated Dissolution Inhibitors for 157 nm Lithography," *Advances in Resist Technology and Processing XIX, Proceedings of SPIE*, 2002, pp. 477-485, vol. 4690.

Hamad et al., "Evaluation of Fluorinated Dissolution Inhibitors for 157 nm Lithography," *Advances in Resist Technology and Processing XX, Proceedings of SPIE*, 2003, pp. 558-568, vol. 5039.

Willson et al., "Fluorinated Polymers and Dissolution Inhibitors for 157nm Microlithography," *Polymeric Materials: Science & Engineering*, 2002, pp. 396-397, vol. 87.

Conley et al., "Dissolution Inhibitors for 157 nm Lithography: A Progress Report," *J. Photopolym. Sci. Technol.*, 2002, pp. 613-617, vol. 15, No. 4.

Kumareswaran et al., "Hydrovinylation of Norbornene. Ligand-Dependent Selectivity and Asymmetric Variations," *Org. Lett.*, 2003, pp. 4345-4348, vol. 5, No. 23.

Tran et al., "Metal-Catalyzed Vinyl Addition Polymers for 157 nm Resist Applications. 2. Fluorinated Norbornenes: Synthesis, Polymerization, and Initial Imaging Results," *Macromolecules*, 2002, pp. 6539-6549, vol. 35.

Database WPI, Section Ch, Week 200228, Derwent Publication Ltd., London, GB; Class A41, AN 2002-220996, XP002460032 & JP 2001 328964 A (Tokyo Ohka Kogyo Co., Ltd.) Nov. 27, 2001 (Nov. 11, 2001) (Abstract).

Exhibit C, submitted in a Declaration Under 37 CFR by Larry Rhodes in an Amendment dated Dec. 8, 2006 in the present application.

\* cited by examiner

DISSOLUTION RATE MODIFIERS FOR PHOTORESIST COMPOSITIONS

CROSS-REFERENCE TO RELATED APPLICATIONS

This application claims priority to U.S. Provisional Application Ser. No. 60/448,612 entitled "Dissolution Rate Modifiers for Photoresist Compositions," filed Feb. 20, 2003 and to U.S. Provisional Application Ser. No. 60/512,126 entitled "Dissolution Rate Modifiers for Photoresist Compositions," filed Oct. 17, 2003.

BACKGROUND OF THE INVENTION

1. Field of the Invention

The present invention relates generally to dissolution rate modifiers for photoresist compositions, and more specifically to dissolution rate modifiers comprising moderately low molecular weight molecules that have an acid labile pendant group.

2. Description of Related Art

For I-line (365 nm) and G-line (436 nm) irradiation, multicomponent positive-tone photoresists based on diazonaphthoquinone and novolac (DNQ-novolac) are commonly used in the electronics industry. In this case, DNQ acts as a dissolution rate modifier (DRM) for the novolac polymer binder or base resin. Thus, the unexposed areas of a positive acting (or positive tone) spin-coated film comprising DNQ-novolac is prevented from dissolving in developer, typically an aqueous solution of tetramethylammonium hydroxide (TMAH). However, upon irradiation, the DNQ undergoes a photochemical reaction forming, in the presence of water, a carboxylic acid derivative. This acid actually accelerates the dissolution of the positive acting novolac polymer binder resin in aqueous TMAH. This type of dissolution rate behavior can be expressed graphically as a function of added DNQ for both the exposed and unexposed areas of the film, referred to as a Meyerhofer plot in the art.

In the 1980's, multicomponent, chemically amplified positive tone photoresists based on poly(p-hydroxystyrene) (PHS) binder resin derivatives were developed in response to a general industry shift from I to G-line wavelengths of 248 nm in order to produce finer features and in response to productivity demands that called for more sensitive photoresists. The PHS binder resins are protected with acid labile groups that impart solubility to PHS in organic solvents such as propylene glycol methyl ether acetate (or PGMEA). Typically, this type of photoresist is formulated with a photoacid generator (or PAG), a compound which absorbs a photon, decomposes and eventually produces a proton. The proton then catalytically deprotects the acid labile group of the binder resin upon heating to form a deprotected binder resin and another equivalent of acid in the exposed regions of the wafer. The acid then deprotects a subsequent acid labile group. This process continues until many acid labile groups are deprotected. In this manner, the initial photochemical event is amplified chemically.

A wafer containing the photoreist is then developed with aqueous TMAH, which dissolves away the exposed regions providing a 3D relief pattern on the silicon wafer. One such exemplary PAG is triphenylsulfonium nonaflate. The sensitivity of such chemically amplified 248 nm positive acting photoresists was enhanced by incorporating a dissolution rate modifier (DRM) in the formulation. In a positive acting formulation, these DRM's act to suppress the dissolution rate of unexposed regions and ideally would enhance dissolution rates in exposed regions.

As the demand for smaller feature sizes grew in the late 1990's, the industry responded by developing chemically amplified photoresists for 193 nm exposure. Unfortunately, at this wavelength, PHS derivatives are too opaque. Four polymer binder resin platforms were identified that exhibited sufficient transparency at 193 nm to be considered as candidates. These were acrylate polymers, cyclic olefin/maleic anhydride copolymers, cyclic olefin/maleic anhydride/acrylate terpolymers, and vinyl addition cyclic olefin polymers. All of these polymers were developed as chemically amplified photoresists by appending acid labile groups to the backbone of the polymer. As in the case of the aforementioned 248 nm photoresists, DRM's used in 193 nm positive tone resist formulations suppress dissolution rates in the unexposed regions which limits dark film loss. Some examples of DRM's developed for such 193 nm photoresists include bile acid esters derived from cholic acid, deoxycholic acid, ursocholic acid and lithocholic acid. The aliphatic hydrocarbon nature of these compounds imparts high transparency at 193 nm and their multicyclic structure and low carbon-to-hydrogen ratios suggest that they should impart good dry etch resistance.

For the next generation of photolithography, exposure at 157 nm is most likely to be used. At this wavelength, the binder resins used at 193 nm are too opaque and, hence, unuseable. Likewise, DRM's such as cholic acid esters or multi-alicyclic compounds as described above will be too opaque. Some fluorinated compounds may be sufficiently transparent at 157 nm to act as DRM's, for example the structures illustrated in FIG. 1.

An ideal DRM would meet the following criteria:
Suppress dissolution of the resist in the unexposed state
Increase dissolution of the resist in the exposed state
Lower or, at least, not increase optical density
Increase or, at least, not decrease etch resistance
Decrease or, at least, not increase surface roughness after etch
Be compatible with binder resin, i.e., not phase separate In addition, an ideal DRM would not suffer from volatilization from the photoresist film during post-apply bake or during post-exposure bake. However, introduction of fluorine in order to keep the optical density low, such as seen in the compounds above, in many cases increases the volatility of the compound.

It is generally known in the literature that chemically amplified resists, irrespective of the wavelength used, need to have the capability of being self-annealing. That is upon heating the photoresist film to a certain temperature, typically above its glass transition temperature, the film densities and decreases the amount of free volume present. This is important since films containing less free volume are less susceptible to air-borne base contaminants such as amines which can migrate through films and quench photochemically generated acids, thus shutting down the deprotection chemistry necessary for imaging. However, chemically amplified photoresist films cannot be heated near the decomposition temperature of the acid labile group. Thus, it is important that the glass transition temperature of the binder resin in the photoresist film be lower than the thermal decomposition temperature of the acid labile group (typically between 200° C. and 220° C.) on the binder resin. Glass transition temperatures of vinyl addition cyclic olefin polymers can be well over 300° C. Thus additives, such as DRM's, that lower the glass transition temperature of the photoresist binder resin would be desirable.

U.S. Pat. No. 6,124,074 to Varanasi et al. discloses acid-catalyzed positive photoresist compositions which are imageable with 193 nm radiation and are developable to form photoresist structures by the use of a combination of cyclic olefin polymers, photosensitive acid generators and hydrophobic non-steroidal multi-alicyclic components containing plural acid labile linking groups. The cyclic olefin polymers preferably contain i) cyclic olefin units having polar functional moieties, and ii) cyclic olefin units having acid labile moieties that inhibit solubility in aqueous alkaline solutions.

U.S. Pat. No. 6,136,499 to Goodall et al. discloses a radiation sensitive photoresist composition that includes a photoacid initiator and a polycyclic polymer comprising repeating units that contain pendant acid labile groups. Upon exposure to an imaging radiation source, the photoacid initiator generates an acid which cleaves the pendant acid labile groups, effecting a polarity change in the polymer. The polymer is rendered soluble in an aqueous base in the areas exposed to the imaging source.

However, none of the above-described photoresist compositions meet the criteria of an ideal DRM as set forth above when used with light at 157 nm. Thus, a need in the art exists for a photoresist composition that provides ideal DRM characteristics at 157 nm.

SUMMARY

Exemplary embodiments of the invention provide a dissolution rate modifier that includes an oligomer encompassing repeating units derived from monomers in accordance with one or more of Formulae A, B, C, D and/or E:

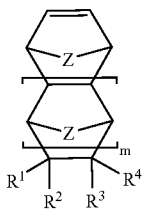

Formula A

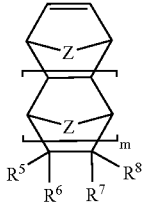

Formula B

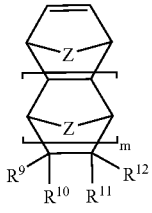

Formula C

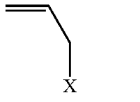

Formula D

Formula E

Oligomers in accordance with embodiments of the present invention encompass repeating units derived from monomers encompassing one or more of the monomers according to Formulae A, B, C, D or E, with the proviso that if A is not present, E must be included and any other monomers present are selected only from B, C and D with the additional proviso that if D is selected, one of B or C must also be selected. In Formulae A through E, m is an integer from 0 to 5; Z is —$CH_2$—, —$CH_2$—$CH_2$—, —O—, —S—, or —NH—, where at least one substituent $R^1$, $R^2$, $R^3$, $R^4$, independently, is a fluorinated carbinol having from 1 to about 10 carbon atoms optionally protected by an acid labile group; and the remaining $R^1$, $R^2$, $R^3$, and $R^4$, independently, are hydrogen, a halogen, or a hydrocarbyl containing from 1 to about 20 carbon atoms, or a hydrocarbyl having from 1 to about 20 carbon atoms substituted at any hydrogen atom with an O, S, N, or Si, or a fluorinated hydrocarbyl having from 1 to about 20 carbon atoms wherein each carbon atom, independently, is substituted with 0, 1, 2, or 3 fluorine atoms. At least one of $R^5$, $R^6$, $R^7$, or $R^8$ independently contain an acid labile moiety, and the remaining one or more $R^5$, $R^6$, $R^7$, or $R^8$, independently, are hydrogen, a halogen, or a hydrocarbyl having from 1 to about 20 carbon atoms, or a hydrocarbyl having from 1 to about 20 carbon atoms substituted at any hydrogen atom with an O, S, N, or Si, or a fluorinated hydrocarbyl having from 1 to about 20 carbon atoms wherein each carbon atom, independently, is substituted with 0, 1, 2, or 3 fluorine atoms. The groups $R^9$, $R^{10}$, $R^{11}$ or $R^{12}$ are independently selected from a hydrogen atom, a halogen, a hydrocarbyl having from 1 to about 20 carbon atoms, and a hydrocarbyl having from 1 to about 20 carbon atoms substituted at any hydrogen atom, with O, S, N, or Si, and optionally contain an epoxy, hydroxyl, and/or carboxylic acid functional group. In the allylic monomers, Y is a fluorinated carbinol having from 1 to about 10 carbon atoms optionally protected by an acid labile group, and X is OH, CN, OC(O)$R^{13}$, C(O)O$R^{13}$, O$R^{13}$, N($R^{13}$)$_2$, where $R^{13}$ is a linear or branched or cyclic aliphatic hydrocarbyl group containing 1 to about 12 carbons atoms and optionally at least one carbon atom of said hydrocarbyl contains 1, 2, or 3 fluorine atoms. The oligomers have a weight average molecular weight (Mw) of less than about 3,000 as measured by Gel Permeation Chromatography.

Other exemplary embodiments of the invention provide a method of making the above-described oligomers, as well as the resulting oligomers, including:

I) forming a monomer mixture comprising one or more of the monomers according to Formulae A through E;

II) adding a free radical initiator to the monomer mixture in an amount sufficient to effect polymerization;

III) heating the mixture in II) to a temperature at which the initiator can effect polymerization.

Additional exemplary embodiments of the invention provide a method of making the above-described oligomers, as well as the resulting oligomers, including:

i) forming a monomer mixture consisting essentially of one or more monomers according to at least one monomer of Formulae A, B, and/or C and an ethylenically unsaturated material; and ii) adding a catalyst containing a Ni or Pd complex, where the addition of a Ni complex requires the addition of a hemilabile, chelating ligand containing a Group 15 and a Group 16 element capable of coordinating to the Ni complex to the monomer mixture.

Another exemplary embodiment of the invention provides a negative tone photoresist composition that includes:
  A) a solvent;
  B) a photosensitive acid generator;
  C) a crosslinking agent containing functional groups;
  D) one or more negative tone imaging polymeric resins containing functional groups that are reactive with the functional groups in the crosslinking agent; and
  E) the above-described dissolution rate modifier.

Exemplary embodiments of the invention also provide a positive tone photoresist composition that includes:
  A) a solvent;
  B) a photosensitive acid generator;
  C) one or more positive tone imaging polymers including a functional group containing moiety that contains a group that can be cleaved when exposed to radiation, rendering the polymer more soluble to a developer than the unexposed polymer, and
  D) the above-described dissolution rate modifier.

Exemplary embodiments of the invention further provide a method of generating a positive or negative tone resist image including:
  (a) coating a substrate with a film containing a negative tone photoresist composition or a positive tone photoresist composition described above to form a film;
  (b) imagewise exposing the film to radiation to form an image;
  (c) post exposure baking of the film; and
  (d) developing the image.

Exemplary embodiments of the invention additionally provide an integrated circuit assembly method including:
  (a) coating a substrate with the above-described negative tone or positive tone photoresist composition;
  (b) imagewise exposing the film to radiation;
  (c) post exposure baking of the film;
  (d) developing the image to expose the substrate; and
  (e) forming the circuit in the developed film on the substrate; as well as integrated circuit chips, multichip modules, or circuit boards including the integrated circuit provides by the above-described method.

Also provides by exemplary embodiments of the invention is an integrated circuit assembly method that includes:
  (a) coating a substrate with the above-described positive tone or negative tone photoresist composition;
  (b) imagewise exposing the film to radiation;
  (c) post exposure baking of the film;
  (d) developing the image to expose the substrate; and
  (e) forming the circuit in the developed film on the substrate; as well as integrated circuit chips, multichip modules, or circuit boards including the integrated circuit provides by the above-described method.

DESCRIPTION OF EXEMPLARY EMBODIMENTS

Figure 1:
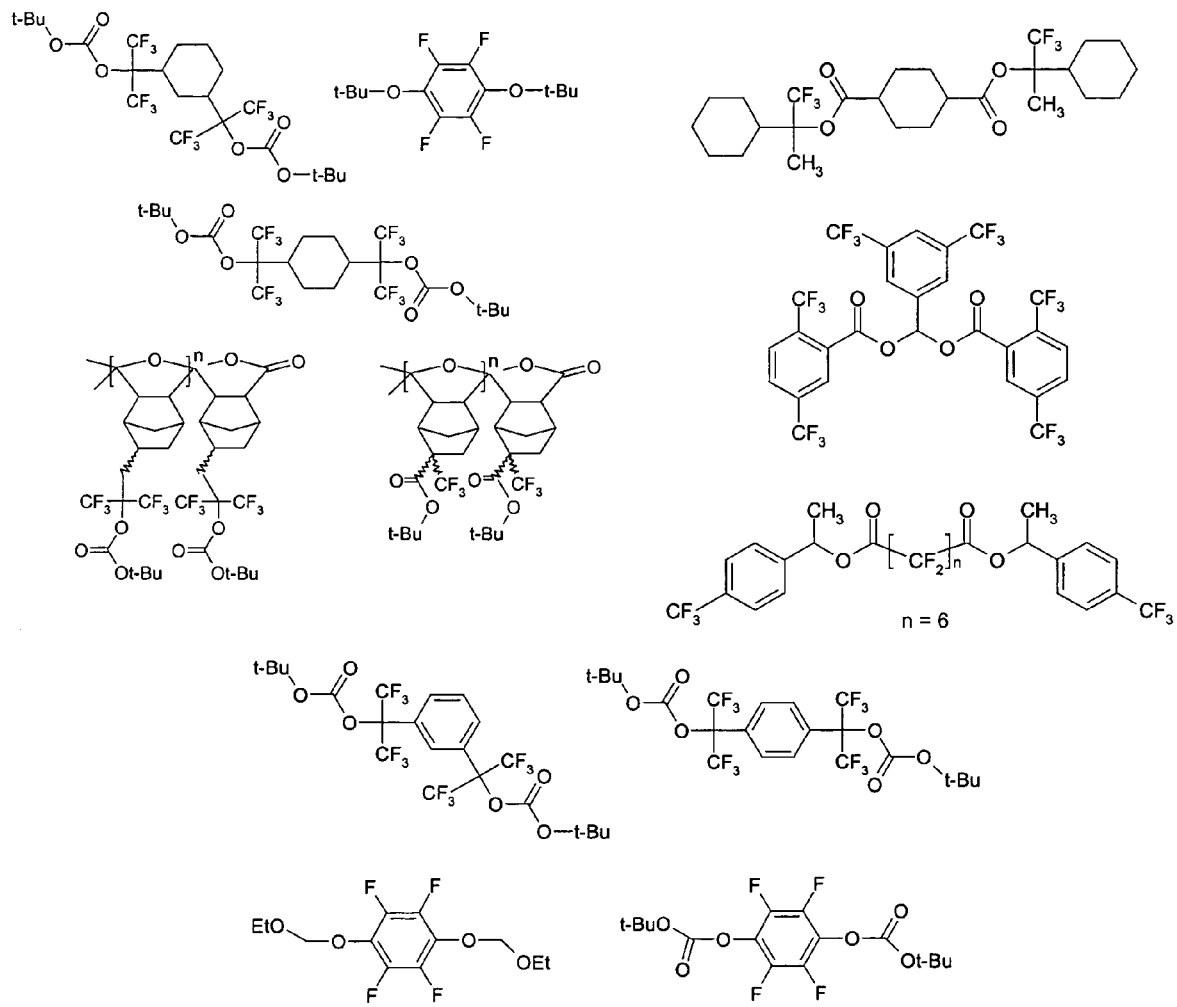
FIG. 1 shows structures of prior art potential dissolution rate modifiers.
Figure 2:
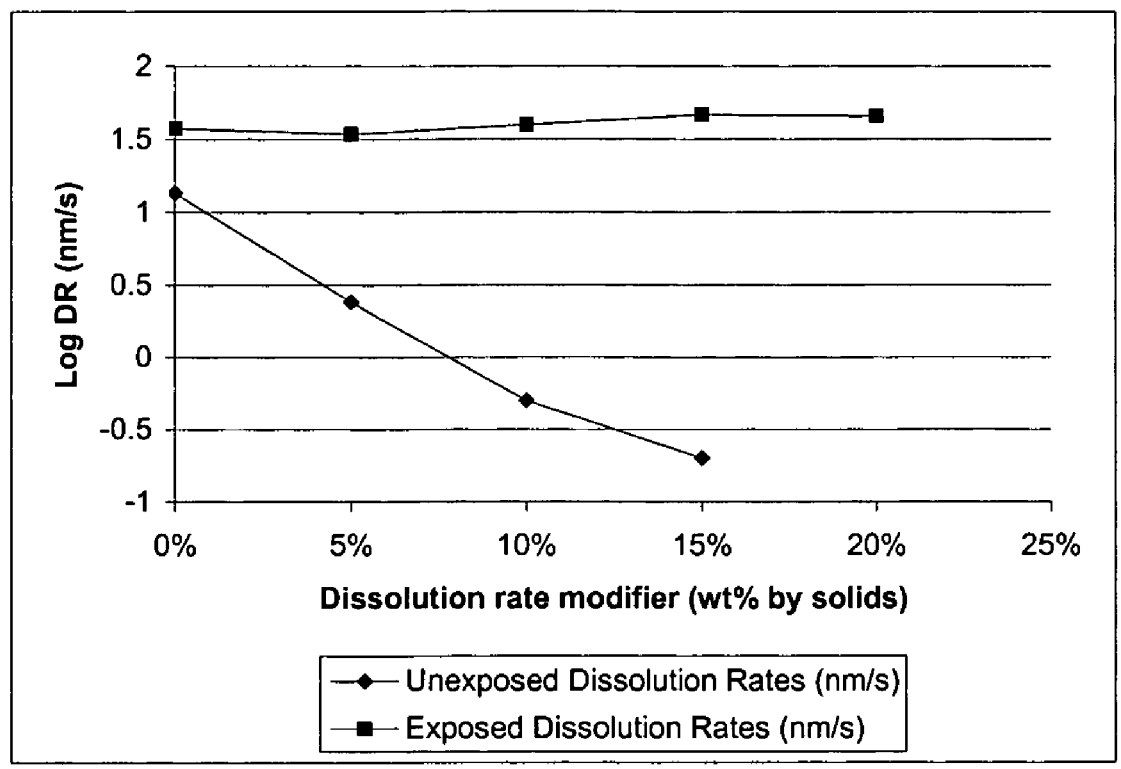
FIG. 2 shows a "simulated" Meyerhofer plot of dissolution rate versus dissolution rate modifier concentration.

Unless otherwise indicated, all numbers, values and/or expressions referring to quantities of ingredients, reaction conditions, etc., used herein are to be understood as modified in all instances by the term "about."

Various numerical ranges are disclosed in this patent application. Because these ranges are continuous, they include every value between the minimum and maximum values of each range. Unless expressly indicated otherwise, the various numerical ranges specified in this specification and in the claims are approximations that are reflective of the various uncertainties of measurement encountered in obtaining such values.

As used herein, the term "oligomer" refers to a molecule or mixture of molecules formed from an addition reaction. A non-limiting example of an oligomer as used in the present invention is the molecules that result from the addition of two or more polycyclic olefin monomers to one another and optionally at least one polycyclic olefin monomer with another ethylenically unsaturated monomer and/or a chain transfer agent. In many embodiments, oligomers according to the present invention will have a number average molecular weight (Mn) of less than about 3,000 as determined in THF by gel permeation chromatography (GPC) using polystyrene standards.

As used herein, the term "cure" (or "curing") is intended to refer to crosslinking of the photodefinable dielectric composition components to result in the development of the desired physical and chemical properties of the resultant film, non-limiting examples of such being a low dielectric constant, low moisture uptake properties, low modulus and resistance to chemicals. When processing the polymer composition, the composition may be partially cured in one processing step and the cure 'completed' in a subsequent processing step.

As used herein, the term "polycyclic olefin monomer" refers to molecules that contain at least two interdisposed ring structures and a polymerizable double bond. Non-limiting examples of polycyclic olefin monomers according to the invention include norbornene-type or norbornene-functional monomers that contains at least one norbornene moiety as shown below:

As a further non-limiting example, a simple polycyclic monomer according to the invention is the bicyclic monomer, bicyclo[2.2.1]hept-2-ene, commonly referred to as norbornene. When utilized, acid labile functionality can be introduced into the polymer chain by polymerizing a reaction medium that includes one or more acid labile substituted polycyclic monomers set forth in the Formula (I) below, where Z and m are defined below and $R^p$, $R^q$, $R^s$ and $R^t$ are independently H, a hydrocarbyl, flourinated hydrocarbyl or group containing acid labile functionality.

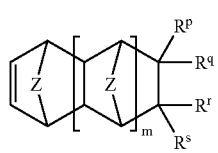

(I)

It will be understood that in the context of this disclosure, the term "low molecular weight" a molecule with molecular weight between about 150 and 3000.

As used herein, "hydrocarbyl" refers to a radical of a group that contains only carbon and hydrogen (in many cases 1 to about 20 carbon atoms), non-limiting examples being alkyl, aryl, aralkyl, alkaryl, and alkenyl. The term "fluorinated hydrocarbyl" refers to a hydrocarbyl group having from 1 to about 20 carbon atoms wherein each carbon atom, independently, is substituted with 0, 1, 2, or 3 fluorine atoms.

As used herein, "alkyl" refers to a linear or branched acyclic or cyclic, saturated hydrocarbon group having a carbon chain length of, for example, from $C_1$ to $C_{25}$. Nonlimiting examples of suitable alkyl groups include, —$(CH_2)_3CH_3$, —$(CH_2)_4CH_3$, —$(CH_2)_5CH_3$, —$(CH_2)_{10}CH_3$, —$(CH_2)_{23}CH_3$, and cyclohexyl. The term "alkylol" refers to alkyl groups that include one or more hydroxyl groups.

As used herein the term "aryl" refers to aromatic groups that include, without limitation, groups such as phenyl, biphenyl, benzyl, xylyl, naphthalenyl, anthracenyl and the like, as well as heterocyclic aromatic groups that include, without limitation, pyridinyl, pyrrolyl, furanyl, thiophenyl, and the like.

As used herein, "alkaryl" refers to a linear or branched acyclic alkyl group substituted with at least one aryl group, for example, phenyl, and having an alkyl carbon chain length of $C_2$ to $C_{25}$. The aryl group can be further substituted, if desired. Nonlimiting examples of suitable substituent groups for the aryl group include, but are not limited to, hydroxyl groups, benzyl groups, carboxylic acid groups, and aliphatic hydrocarbon groups.

As used herein, "aralkyl" refers to an aryl group substituted with at least one linear or branched acyclic alkyl group, for example, phenyl having an alkyl substituent group with a carbon chain length of $C_2$ to $C_{25}$. The aryl group can be further substituted, if desired. Nonlimiting examples of suitable substituent groups for the aryl group include, hydroxyl groups, benzyl groups, carboxylic acid groups, and aliphatic hydrocarbon groups. The alkyl group can be substituted with halogens.

As used herein, "alkenyl" refers to a linear or branched acyclic or cyclic hydrocarbon group having one or more double bonds and having an alkenyl carbon chain length of $C_2$ to $C_{25}$ and no aromatic character.

As used herein, the term "novolac resin" and similar terms refer to the commonly known family of resins obtained by the condensation of an aldehyde and monohydric or polyhydric phenols.

Embodiments of the present invention are directed to photoresist compositions that include a base resin or polymer binder, a photoacid generator (PAG), a suitable spinning solvent, additives such as base quenchers and sensitizers, and an optically transparent DRM containing one or more of the below noted substituted groups thereon.

According to the concepts of the present invention, low molecular weight oligomers containing fluorinated cyclic olefin repeat units are utilized as a photoresist dissolution rate modifier especially for cyclic olefin based binder resins tailored for 193 and 157 nm photolithography. While such oligomers can be a homooligomer, in many embodiments of the invention cooligomers are utilized. Thus, provided are oligomeric or cooligomeric, denoted as (co)oligomeric, DRM's that suppress dissolution rate of the photoresist composition in the unexposed state and increase dissolution rate of the photoresist composition in the exposed state of the photoresist binder resin or polymer.

Particular embodiments in accordance with the present invention are directed to provide photoresist compositions that meet the criteria of an ideal DRM as set forth above when used with light at 157 nm and 183 nm. In this embodiment, the photoresist composition includes one or more oligomers of polycyclic olefin monomers.

The oligomeric DRM's according to some embodiments of the present invention are made from at least one monomer having a fluorinated acid labile group substituent. In some embodiments, the (co)oligomer can be made from monomers including at least one allyl type monomer that includes a fluorinated acid labile group substituent, for example a monomer in accordance with Formula E below. In such an allyl monomer containing embodiment, at least one norbornene-type monomer in accordance with Formulae A, B or C is also included. As a non-limiting example, an embodiment of the present invention can encompass at least one fluorine containing acid labile protected compound in accordance with Formula A and a linear olefin such as an allylic type monomer in accordance with Formula E. Embodiments of the present invention include a homooligomer derived from Formula A where the monomer employed includes a fluorinated acid labile protected substituent. Considering the at least one Formula A monomer:

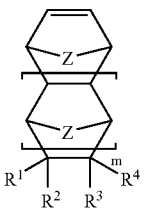

Formula A where m is an integer from 0 to about 5; and Z represents —$CH_2$—, —$CH_2$—$CH_2$—, —O—, —S—, or —NH—, and where at least one substituent, $R^1$, $R^2$, $R^3$, or $R^4$, independently, is a fluorinated alkylol moiety having from 1 to about 10 carbon atoms, and, optionally but in many cases, is protected by an acid labile group (i.e., blocking or protective groups) that is cleavable by acids generated from a photoacid generator. The remaining $R^1$, $R^2$, $R^3$, or $R^4$ groups, independently are selected from hydrogen atom, halogen, or a hydrocarbyl group having from 1 to about 20 carbon atoms, or a substituted hydrocarbyl group substituted at any hydrogen atom thereof with an O, S, N, or Si, and the like, or as a fluorinated hydrocarbyl having from 1 to about 20 carbon atoms wherein each carbon atom, independently, is substituted with 0, 1, 2, or 3 fluorine atoms. Any acid labile group known to the art and to the literature can be employed in the present invention. In particular embodiments of the invention, moieties containing acid labile groups are included in $R^1$, $R^2$, $R^3$, and/or $R^4$. In these embodiments, the acid labile containing moiety can encompass fluorinated compounds including —$((CH_2)_nO)_{n'}$—$CH_2$—$C(OR')(CF_3)_2$ wherein R' is an acid labile group, n and n' are integers from 0 to about 10, and R' includes, but is not limited to, —$CH_2OCH_3$ (dimethyl ether), —$CH_2OCH_2CH_3$ (methyl ethyl ether), —$C(CH_3)_3$, —$Si(CH_3)_3$, —$CH_2COO(t-Bu)$, 2-methylnorbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), or dimethylcyclopropylmethyl (Dmcp) groups, or R' is —$C(O)OR''$ where R'' is —$C(CH_3)_3$, —$Si(CH_3)_3$, 2-methylnorbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), or dimethylcyclopropylmethyl (Dmcp) groups, or combinations thereof; as well as non-fluorinated acid labile groups such as —$((CH_2)_n$—$C(O)OR\#\#$ where n is as defined above and R## is a $C_2$-$C_{10}$ linear, branched or cyclic alkyl or cycloalkyl acid labile group, optionally containing O, S, N, or Si atoms as substituents or heteroatoms along the carbon-carbon chain, non-limiting examples of such being t-butyl and methylcyclopentyl. In particular embodiments of the invention, the acid labile groups are —$CH_2OCH_3$, —$CH_2OCH_2CH_3$, and/or —$C(O)OC(CH_3)_3$. Desirably, at least about 60% or 70%, and in many cases at least about 80% or 90%, of the fluorinated $R^1$, $R^2$, $R^3$, or $R^4$ groups are protected by an acid labile group.

In a particular embodiment, Formula A represents the following Formula A1, where n and R' are defined above.

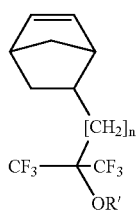

Formula A1

In some embodiments, Formula A represents one or more of the following Formulae A2, A3, or A4 as follows:

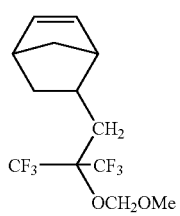

Formula A2

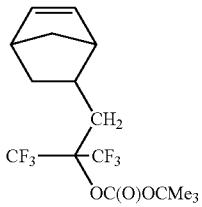

Formula A3

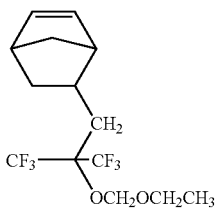

Formula A4

In an embodiment of the present invention, at least one optional additional monomer according to Formula B can be utilized to form a cooligomer.

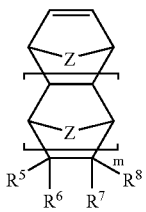

Formula B

In Formula B, m and Z are defined as above and at least one of $R^5$, $R^6$, $R^7$, or $R^8$, independently, contains an acid labile moiety that is cleavable by an acid generated from a photoacid generator. Any known acid labile group known to the literature and to the art can be utilized in the present invention such as those set forth hereinabove with regard to Formula I. The remaining one or more $R^5$, $R^6$, $R^7$, or $R^8$, groups, independently, can be hydrogen, or a hydrocarbyl having from 1 to about 20 carbon atoms, or a hydrocarbyl having from 1 to about 20 carbon atoms substituted at any hydrogen atom with an O, S, N, or Si, and the like, or a fluorinated hydrocarbyl having from 1 to about 20 carbon atoms wherein each carbon atom, independently, is substituted with 0, 1, 2, or 3 fluorine atoms.

In a particular embodiment of the invention, the Formula B monomer is represented by Formula B1.

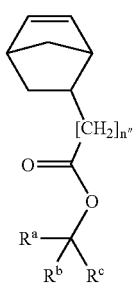

Formula B1

In Formula B1, n" is an integer from 0 to 5, and $R^a$, $R^b$, and $R^c$ independently represent linear or branched hydrocarbyl groups from $C_1$ to about $C_{20}$ or where $R^a$ and $R^b$ taken together along with the common carbon to which they are attached can represent saturated cyclic groups containing 4 to 12 carbon atoms.

In some embodiments, the Formula B monomer containing an acid labile group can be a monomer represented by Formula B2

Formula B2

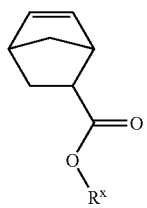

where $R^x$ is a tertiary butyl group or a methylcyclopentyl group.

In a further embodiment of the invention, another optional comonomer can be used as described by Formula C.

Formula C

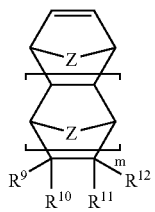

In Formula C, m and Z are defined as above, and $R^9$ through $R^{12}$, independently, are chosen such that the hydrophilicity of the resulting cooligomer can be controlled. $R^9$, $R^{10}$, $R^{11}$, or $R^{12}$, independently, can be a hydrogen atom, halogen, or a hydrocarbyl having from 1 to about 20 carbon atoms, or a hydrocarbyl having from 1 to about 20 carbon atoms substituted at any hydrogen atom with an O, S, N, or Si, and the like. When $R^9$ through $R^{12}$ are substantially hydrocarbon in nature, the hydrophilicity of the resulting polymer is lowered, whereas when $R^9$ through $R^{12}$ substantially contains heteroatoms, the hydrophilicity of the resulting polymer is increased. Thus, at least one of $R^9$, $R_{10}$, $R^{11}$, or $R^{12}$ can optionally contain an epoxy, hydroxyl, and/or carboxylic acid functional group. It will be realized that each monomer in accordance with Formulae A, B or C are norbornene-type monomers in that each has, at least in some part, a norbornene structure.

An additional embodiment of the invention is directed to another monomer that can be included in dissolution rate modifiers according to the present invention. In this embodiment, at least one functional allylic type monomer of Formula D is included.

Formula D

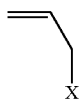

In Formula D, X represents OH, CN, $OC(O)R^{13}$, $C(O)OR^{13}$, $OR^{13}$, or $N(R^{13})_2$, where $R^{13}$ is a linear or branched or cyclic aliphatic hydrocarbyl group containing 1 to about 12 carbons atoms and optionally at least one carbon atom of said hydrocarbyl can contain 1, 2, or 3 fluorine atoms. Advantageous compounds within this embodiment include allyl alcohol, allyl nitrile, and allyl cyanide.

As noted above, another fluorinated monomer which can be utilized in making the dissolution rate modifier cooligomer is at least one allylic type monomer represented by Formula E:

Formula E

where Y is a fluorinated carbinol moiety having from 1 to about 10 carbon atoms and optionally can be protected by an acid labile group which is cleavable by an acid generated from a photoacid generator. Examples of suitable acid labile groups are known to the art and to the literature, and are also set forth hereinabove with respect to the acid labile group of Formula A, and accordingly Y includes —$CH_2)_n$—C(OR') $(CF_3)_2$ in which n is an integer from 0 to 10, and R' includes, but is not limited to, —$CH_2OCH_3$ (dimethyl ether), —$CH_2OCH_2CH_3$ (methyl ethyl ether), —$C(CH_3)_3$, —Si $(CH_3)_3$, 2-methylnorbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), or dimethylcyclopropylmethyl (Dmcp) groups, or —C(O)OR" where R" is —$C(CH_3)_3$, —$Si(CH_3)_3$, 2-methylnorbornyl, 2-methylisobornyl, 2-methyl-2-adamantyl, tetrahydrofuranyl, tetrahydropyranoyl, 3-oxocyclohexanonyl, mevalonic lactonyl, dicyclopropylmethyl (Dcpm), or dimethylcyclopropylmethyl (Dmcp) groups, or combinations thereof. Of these acid labile groups, —$CH_2OCH_3$, —$CH_2OCH_2CH_3$, —$C(O)OC(CH_3)_3$ are advantageous.

In some embodiments of the present invention, the fluorinated allyl-type monomer is defined by the Formulae E1 or E2 below:

Formula E1

Formula E2

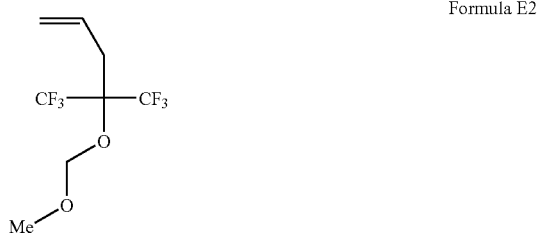

where Me is methyl.

In some embodiments of the present invention, the oligomeric or cooligomeric dissolution rate modifiers are derived from either a Formula A fluorinated norbornene type monomer, or a Formula E fluorinated type monomer with a Formula B and/or Formula C monomer, with the proviso that at least a majority, desirably at least about 60%, in some cases about 70%, in other cases at least about 80%, and in some situations about 90% of the fluorinated carbinol groups are protected by an acid labile group.

The various fluorinated carbinol monomers can be protected by either adding the acid labile group directly to a fluorinated carbinol monomer and subsequently (co)oligomerizing the same, or initially oligomerizing the fluorinated monomers to form the oligomer or cooligomer and subsequently reacting the same with compounds to form the above noted acid labile compounds. This latter method is referred to as post oligomerization protection wherein the hydroxyl hydrogen is substituted by the protecting acid labile group.

Figure 15:
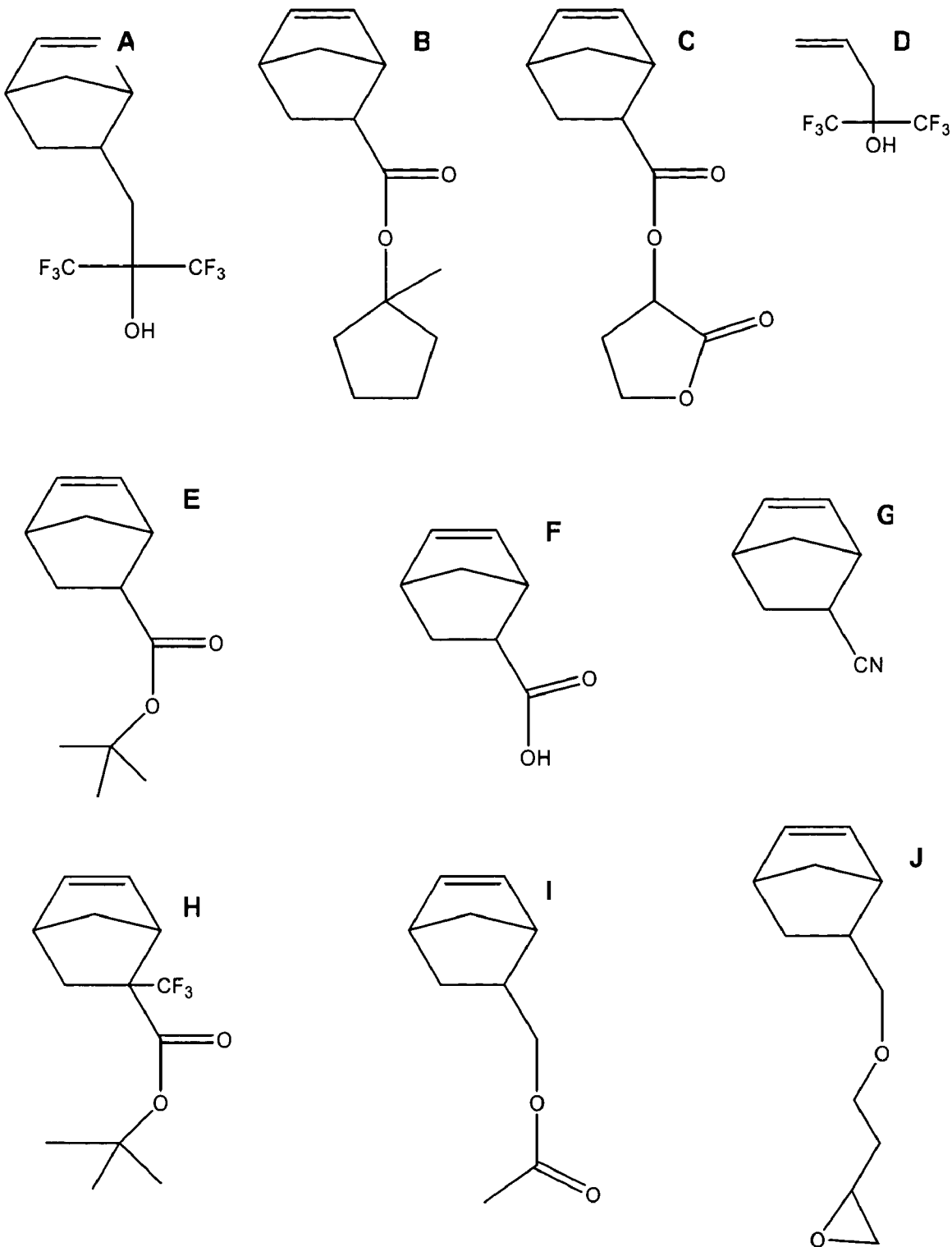
FIG. 15 shows structures of monomers that can be used to make the dissolution rate modifiers of the present invention.

In an embodiment of the invention, the monomers according to Formulae A through E can include one or more of the monomer structures A through J in FIG. 15.

The oligomeric DRM's of the present invention exhibit relatively low weight average molecular weight, generally from about 150 to about 3,000 and desirably from about 500 to about 2,000 as measured by gel permeation chromatography using appropriate standards. The oligomeric DRM's which are generally cooligomers accordingly contain a multiplicity of repeat units derived from the one or more monomers represented by Formulae A through E. Such oligomeric DRM's must comprise a fluorinated acid labile group monomer derived from either Formula A or E where if such oligomeric DRM's cannot have only monomers according to Formula D and E. Therefore, oligomeric DRM's in accordance with embodiments of the present invention encompass repeating units derived from monomers encompassing one or more of the monomers according to Formulae A, B, C, D or E, with the proviso that if A is not present, E must be included and any other monomers present are selected only from B, C and D with the additional provisio that if D is selected, one of B or C must also be selected. The number of repeat groups of the Formula A monomer can be zero or from about 1%, or from about 5%, or from about 10% to about 90% or to about 95%, or to about 99% or to about 100%, in some cases from about 20% to about 85%, in other cases at least 30%, in some situations at least 40% to up to 70% and in some cases up to about 80% of the total number of repeat groups forming the DRM. The number of repeat groups according to Formula (I) can vary between any of the values recited above.

When a Formula E type monomer is not utilized, the number of repeat groups thereof is zero; otherwise it can range from about 1%, or from about 5%, or from about 10% to about 85%, or to about 90% or to about 95%, or to about 99% of the total number of repeat groups forming the DRM. The number of repeat groups according to Formula E can vary between any of the values recited above. As noted above, when a Formula A monomer is not utilized but rather only a fluorinated Formula E monomer is utilized, the Formula E monomer is utilized with a Formula B monomer, or a Formula C monomer, or both. In any event, the amount of the Formula B monomer and Formula C monomer, independently, is 0%, or from about 1%, or from about 5% to about 90%, or to about 95% and in many cases from about 5%, or from about 10% to about 50% of the total number of repeat units forming the DRM. The number of repeat groups according to Formula B and/or Formula C can independantly vary between any of the values recited above. The amount of the Formula D monomer can be the same, that is 0%, or from about 1%, or from about 5% to about 90%, or to about 95% and desirably from about 5%, or from about 10% to about 50% based on the total number of repeat units forming the DRM. The number of repeat groups according to Formula D can vary between any of the values recited above.

Since the various monomers as represented by Formula A and Formulae B through E can contain various substituents thereon as noted by $R^1$ through $R^{12}$, X, and Y, and since the amount and type of repeat groups forming the DRM can vary, it should be apparent that a very large number of permutations can exist within the metes and bounds of the present invention.

Figure 16:
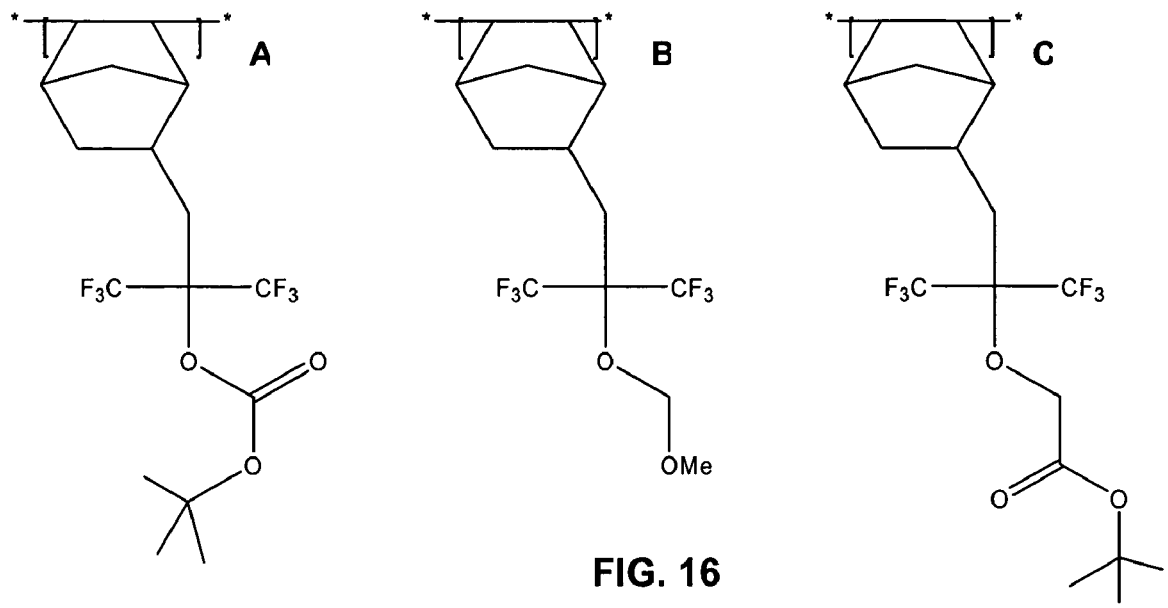
FIG. 16 shows the structures of acid labile repeat units derived from $\alpha,\alpha$-bis(trifluoromethyl)bicyclo[2.2.1]hept-5-ene-2-ethanol (HFANB) type monomers that can be used according to the invention.
Figure 17:
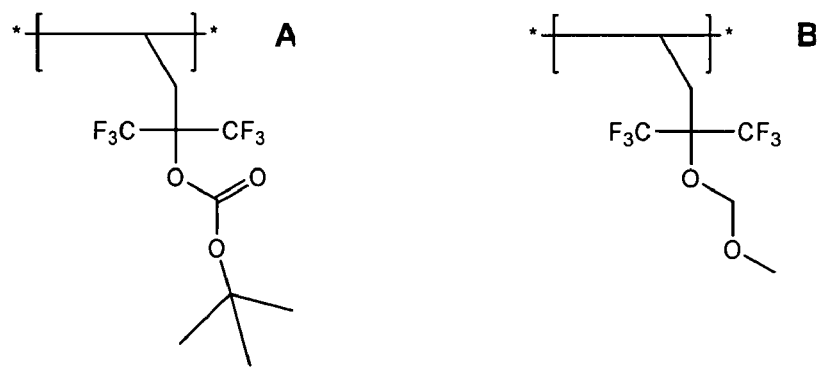
FIG. 17 shows the structures of acid labile repeat units derived from 1-bis(trifluoromethyl)-3-buten-1-ol (Allyl HFA) type monomers that can be used according to the invention.

In particular embodiments of the invention, the present (co)oligomers can include acid labile repeat units derived from HFANB type monomers according to Formula A, shown as structures A, B, and C in FIG. 16. Additionally, the present (co)oligomers can include acid labile repeat units derived from Allyl HFA type monomers according to Formula E, shown as structures A and B in FIG. 17.

In a particular embodiment of the invention, $R^9$, $R^{10}$, $R^{11}$ and $R^{12}$ in Formula C can independently be selected from one of the following groups:

(a) a group according to Formula (II):

$$-R^{16}-C(O)-W-R^{17} \qquad (II)$$

where $R^{16}$ is selected from a covalent bond, $C_1$ to $C_{25}$ linear, branched, or cyclic alkylene, arylene, aralkylene, alkarylene, alkenylene or alkynylene, which can optionally contain halides; W is selected from O, S, and $NR^{18}$, wherein $R^{18}$ is selected from H, and $C_1$ to $C_6$ linear, branched, or cyclic alkyl; and $R^{17}$ is selected from H, $C_1$ to $C_{25}$ linear, branched, or cyclic alkyl, aryl, aralkyl, alkaryl, alkenyl or alkynyl, which can optionally contain halides, and —OH, alkyl, aralkyl, and alkaryl terminated poly(alkyleneoxide) radicals; and (b) a hydroxy alkyl ether according to Formula (III):

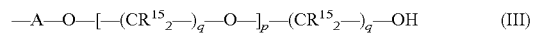

$$-A-O-[-(CR^{15}_2-)_q-O-]_p-(CR^{15}_2-)_q-OH \qquad (III)$$

where A is a linking group selected from $C_1$ to $C_6$ linear, branched, or cyclic alkylene, each occurrence of $R^{15}$ is independently selected from H, methyl, ethyl and a halide, q is from 1 to 5, and p is from 0 to 3.

In another particular embodiment of the invention, $R^5$, $R^6$, $R^7$ and $R^8$ in Formula B can independently be selected from a group according to Formula IV:

$$-R^{19}-C(O)-O-R^{20} \qquad (IV)$$

where $R^{19}$ is selected from $C_1$ to $C_{12}$ linear, branched, or cyclic alkylene, and $R^{20}$ is selected from $C_1$ to $C_{22}$ linear, branched, or cyclic alkyl, aralkyl, or alkaryl, and a hydroxy alkyl ether according to Formula (V):

$$-[-(CR^{15}_2-)_q-O-]_p-R^{21} \qquad (V)$$

where each occurrence of $R^{15}$ is independently selected from H, methyl, ethyl and a halide; q is from 1 to 5; p is from 1 to 20; and $R^{21}$ is selected from $C_1$ to $C_{22}$ linear, branched, or cyclic alkyl, aralkyl, or alkaryl.

Also, further to this embodiment, the polycyclic olefin monomers according to Formula C can include monomers according to structure (VI):

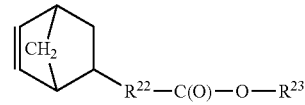

(VI)

where $R^{22}$ is selected from $C_1$ to $C_8$ linear and branched alkylene, and $R^{23}$ is selected from $C_1$ to $C_8$ linear and branched alkyl.

In an embodiment of the present invention, the polycyclic olefin monomers can include, but are not limited to, t-butyl ester of 5-norbornene-2-carboxylic acid, 2-oxocyclopentyl ester of 5-norbornene-2-carboxylic acid, 1-methylcyclopentyl ester of 5-norbornene-2-carboxylic acid, 5-[(2,3-epoxypropoxy)methyl]-2-norbornene, 5-(2-hydroxy-2,2-bis-trifluoromethyl)ethyl-2-norbornene, 2-(trifluoromethyl)-1,1-dimethylethyl ester of 5-norbornene-2-carboxylic acid, and 5-norbornene-2-methanol acetate.

In an embodiment of the invention, the oligomers of polycyclic olefin monomers are provided according to a method whereby polycyclic olefin monomers are reacted in the presence of a Ni or Pd containing catalyst as described in further detail below. Exemplary Ni or Pd catalyst complexes encompass a Ni or Pd complex, where for a Ni complex a hemilabile, chelating ligand containing a Group 15 and a Group 16 element capable of coordinating to the Ni complex is required, and an ethylenically unsaturated compound. Further to this embodiment, the polycyclic olefin monomers can include one or more monomers according to Formulae A, B, and C. Thus, embodiments of the present invention provide a method of making the above described oligomers by:

i) forming a monomer mixture consisting essentially of one or more monomers according to at least one monomer of Formulae A, B, and/or C and an ethylenically unsaturated material; and ii) adding a catalyst containing a Ni or Pd complex, where for a Ni complex a hemilabile, chelating ligand containing a Group 15 and a Group 16 element capable of coordinating to the Ni complex is required, to the monomer mixture.

In an embodiment of the present invention, the oligomers of polycyclic olefin monomers include oligomers containing two polycyclic olefin monomers according to one or more of Formulae A, B, and C. Further to this embodiment, the oligomers of polycyclic olefin monomers can additionally include reaction products of other ethylenically unsaturated materials, non-limiting examples being ethylene, propylene, butylene, isobutylene, pentene, hexene, and the like.

In a particular exemplary embodiment of the invention, when polycyclic olefin monomers according to Formulae A, B and/or C are used, the oligomers of polycyclic olefin monomers encompass at least 80, in some cases at least 85 and in other cases a least 90 mole percent of the mixture of reaction products of one or two polycyclic olefin monomers and ethylene according to the structures of codimer Formula (VIIa) and codimer Formula VIIb):

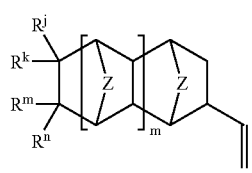
(VIIa)

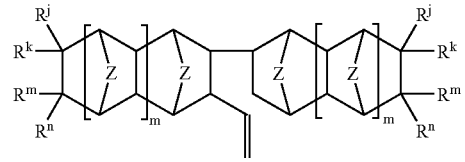

where each occurrence of Z is independently selected from —$CH_2$—, —$CH_2$—$CH_2$—, O, S, and —NH—; each occurrence of m is independently an integer from 0 to 5; and each occurrence of $R^j$ can be selected from $R^1$, $R^5$ or $R^9$; $R^k$ can be selected from $R^2$, $R^6$, or $R^{10}$; $R^m$ can be selected from $R^3$, $R^7$ or $R^{11}$; and $R^n$ can be selected from $R^4$, $R^8$ or $R^{12}$, as defined above.

Embodiments of the present invention also provide oligomers of polycyclic olefin monomers obtained from the above-described methods.

The inventive oligomers can be treated to eliminate unsaturated groups. As a non-limiting example, olefin containing oligomers can be treated with peracetic acid. It is believed that the peracetic acid converts the olefinic groups into epoxides and ring-opening products thereof.

In some embodiments of the invention, protecting groups will be added to the oligomer. Non-limiting examples of exemplary protecting groups that can be used include methoxy methyl ether (MOM), tert-butyl carbonyl methyl, —$C(CH_3)_3$, —$Si(CH_3)_3$, —$CH_2COO(t$-Bu$)$, 2-methylnorbornyl, 2-methylisobornyl, , 2-methyl-2-adamantyl, tetrahydrofuranyl, tetrahydropyranoyl, 3-oxocyclohexanonyl, mevalonic lactonyl, and dicyclopropylmethyl (Dcpm).

Where nickel complexes are employed such, encompass an organonickel complex cation and a weakly coordinating counteranion. Exemplary cationic nickel complexes are described in U.S. Pat. No. 5,468,819, the pertinent parts of which are incorporated herein by reference. In embodiments of the invention, the cationic nickel catalyst complex is represented by:

$[L'_y NiX^\wedge_z]WCA$ (VIII)

where L' represents a ligand containing 1, 2, or 3 olefinic $\pi$ bonds; X^ represents a ligand containing 1 Ni—C $\sigma$ bond and between 0-3 olefinic $\pi$ bonds; y is 0, 1, or 2 and z is 0 or 1, where y and z cannot both be 0 at the same time; L' represents a neutral ligand that is weakly coordinated to the nickel. Regarding L', while not being bound to any one theory, it is believed that the ligand is relatively inert and is readily displace from the metal cation complex by the inserting monomer in the growing polymer chain. Suitable ligands include, but are not limited to, ($C_2$ to $C_{12}$) monoolefinic (e.g., 2,3-dimethyl-2-butene), diolefinic ($C_4$-$C_{12}$) (e.g., norbornadiene) and ($C_6$ to $C_{20}$) aromatic moieties. In many cases ligand L is a chelating bidentate cyclo($C_6$ to $C_{12}$) diolefin, for example cyclooctadiene or dibenzo cyclooctadiene, or an aromatic compound such as benzene, toluene, or mesitylene. X^, in some embodiments, is a single allyl ligand or, a canonical form thereof, which provides a $\sigma$ and a $\pi$ bond. Also, in some embodiments of the invention WCA is a weakly coordinating anion as described below. In particular embodiments of the invention, the complexes of Formula (VIII) include, but are not limited to, [(allyl)Ni(1,4-cyclooctadiene)]PF$_6$, [(crotyl)Ni(1,4-cyclooctadiene)]PF$_6$, and [(allyl)Ni(1,4-cyclooctadiene)]SbF$_6$.

In an embodiment of the invention, the Ni catalyst includes a chelating hemilabile ligand according to Formula F, where hemilabile is understood by those skilled in the art as described by a) Jeffery, J. C.; Rauchfuss, T. B. *Inorg. Chem.* 1979, 18, 2658. b) Bader, A.; Lindner, E. Coord. Chem. Rev. 1991,108, 27. c) Slone, C. S.; Weinberger, D. A.; Mirkin, C. A. *Prog. Inorg. Chem.* 1999, 48, 233.:

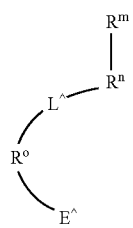

Formula F where L^ represents a Group 15 element, (for example, selected from N, P, As, or Sb), E^ represents OR$^e$, C(=O)R$^e$, C(=O)OR$^e$, where R$^e$ represents C$_1$-C$_{24}$ alkyl, aryl, alkaryl, and aralkyl. Examples of such ligands include, but are not limited to, those according to Formulae G-Q:

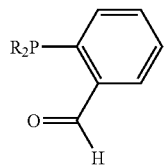

G

R = phenyl, cyclohexyl, t-butyl, methyl, ethyl, propyl

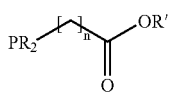

H

R = phenyl, cyclohexyl, t-butyl, methyl, ethyl, propyl
R' = methyl, ethyl, propyl
n = 1, 2, 3

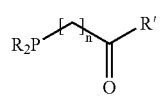

I

R = phenyl, cyclohexyl, t-butyl, methyl, ethyl, propyl
R' = phenyl, C$_6$F$_5$, N(C$_6$H$_5$)$_2$
n = 1, 2, 3

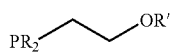

J

R = phenyl, cyclohexyl, methyl, propyl
R' = methyl, propyl, i-propyl

K

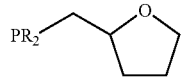

L

R = phenyl, cyclohexyl, methyl, propyl, i-propyl

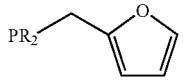

M

R = phenyl, methyl

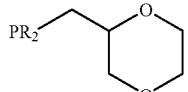

N

R = phenyl, cyclohexyl, methyl, mesityl

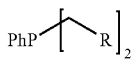

O

R = CH$_2$OMe, C$_4$H$_7$O, C$_4$H$_7$O$_2$

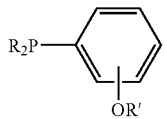

P

R = independently methyl, t-butyl, phenyl, cyclohexyl
R' = Me, CH2Ph

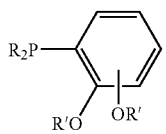

Q

R = independently methyl, t-butyl, phenyl, cyclohexyl
R' = Me, CH2Ph

In a further embodiment, suitable cocatalysts include, but are not limited to, (2-methoxyphenyl)diphenylphosphine, R-(+)-(2'-methoxy[1,1'-binaphthalene)]-2-yl)diphenylphosphine, tri(o-methoxyphenyl)phosphine, tri(p-methoxyphenyl)phosphine, tri(m-methoxyphenyl)phosphine, and mixtures thereof.

While not being bound by the theory of invention, it is thought that the chelating hemilabile ligands of the present invention coordinate to the nickel cation complex through the Group 15 and the Group 16 element of the hemilabile, chelating ligand. The hemilabile, chelating ligand is bonded more strongly to the nickel cation complex through the Group 15 element than the Group 16 element. The Group 16 element moiety of the hemilabile, chelating ligand is then thought to be labile in solution allowing access of the monomers of the present invention to the nickel cation.

Additional exemplary embodiments of the invention utilize palladiumcatalyst complexes. The palladium complexes are neutral and contain Group 15 ligands accompanied by salts of weakly coordinating anions as disclosed in U.S. Pat. No. 6,455,650, incorporated herein by reference. Other palladium complexes are cationic and are ligated by Group 15 ligands where a weakly coordinating anion is incorporated therein to balance any charge.

Particular embodiments of the invention utilize one or more catalysts selected from trans-[Pd(NCMe)(OAc)(P(i-propyl)₃)₂]B(C₆F₅)₄,
trans-[Pd(NCC(CH₃)₃)(OAc)(P(i-propyl)₃)₂]B(C₆F₅)₄,
trans-[Pd(OC(C₆H₅)₂)(OAc)(P(i-propyl)₃)₂]B(C₆F₅)₄,
trans-[Pd(HOCH(CH₃)₂)(OAc)(P(I-propyl)₃)₂]B(C₆F₅)₄,
trans-[Pd(NCMe)(OAc)(P(cyclohexyl)₃)₂]B(C₆F₅)₄,
Pd(OAc)₂(P(cyclohexyl)₃)₂,
Pd(OAc)₂(P(I-propyl)₃)₂, Pd(OAc)₂(P(i-propyl)₂(phenyl))₂,
trans-[Pd(NCMe)(OAc)(P(cyclohexyl)₂(t-butyl))₂]B(C₆F₅)₄ and mixtures thereof.

In embodiments of the invention, the catalyst complex is represented by:

[(E'(R)₃)₂Pd(Q)₂]    (IX)

In other embodiments, the catalyst complexes is represented by:

[(E'(R)₃)₂Pd(Q)(LB)][WCA]    (X)

In Formulae (IX) and (X), E'(R)₃ represents a Group 15 neutral electron donor ligand wherein E is selected from a Group 15 element of the Periodic Table of the Elements, and R independently represents hydrogen or an anionic hydrocarbyl containing moiety; Q represents an anionic ligand selected from a carboxylate, thiocarboxylate, and dithiocarboxylate group; LB represents a Lewis base; WCA represents a weakly coordinating anion. Where catalyst complexes in accordance with Formula IX are employed, salts of weakly coordinating anions are added. Where catalyst complexes in accordance with Formula X are employed, salts of weakly coordinating anions can be added to increase catalyst activity.

As used herein, the term "weakly coordinating anion" (WCA) refers to an anion which is generally only weakly coordinated to the palladium cation. It is sufficiently labile to be displaced by solvent or monomer. More specifically, the WCA anion functions as a stabilizing anion to the palladium cation and does not transfer to the cation to form a neutral product. The WCA anion is relatively inert in that it is non-oxidizing, non-reducing, and non-nucleophilic. As stated herein, a neutral electron donor is any ligand which, when removed from the palladium metal center in its closed shell electron configuration, has a neutral charge. Further, an anionic hydrocarbyl moiety is any hydrocarbyl group which when removed from the Group 15 element, E', in its closed shell electron configuration, has a negative charge. Additionally, a Lewis base is a donor of electron density (i.e., a pair of electrons).

In some embodiments in accordance with the present invention, E is selected from nitrogen, phosphorus, arsenic, and antimony, and the anionic hydrocarbyl containing moiety, R is independently selected from, but not limited to, linear and branched (C₁-C₂₀) alkyl, (C₃-C₁₂) cycloalkyl, (C₂-C₁₂) alkenyl, (C₃-C₁₂) cycloalkenyl, (C₅-C₂₀) polycycloalkyl, (C₅-C₂₀) polycycloalkenyl, and (C₆-C₁₂) aryl, and two or more R groups taken together with E can form a heterocyclic or heteropolycyclic ring containing 5 to 24 atoms.

Representative alkyl groups include, but are not limited to, methyl, ethyl, propyl, isopropyl, n-butyl, isobutyl, sec-butyl, tert-butyl, pentyl, and neopentyl. Representative alkenyl groups include, but are not limited to, vinyl, allyl, iso-propenyl, and iso-butenyl. Representative cycloalkyl groups include, but are not limited to, cyclopropyl, cyclobutyl, cyclopentyl, cyclohexyl, and cyclooctyl. Representative polycycloalkyl groups include, but are not limited to, norbomyl and adamantyl. Representative polycycloalkenyl groups include, but are not limited to, norbornenyl and adamantenyl. Representative aryl and aralkyl groups include, but are not limited to, phenyl, naphthyl and benzyl.

In an exemplary embodiment of the invention, the Group 15 neutral electron donor ligand is selected from a phosphine. Representative phosphine ligands include, but are not limited to, trimethylphosphine, triethylphosphine, tri-n-propylphosphine, tri-isopropylphosphine, tri-n-butylphosphine, and tri-sec-butylphosphine. Other suitable phosphine ligands are exemplified in U.S. Pat. No. 6,455,650, the pertinent portion of which is herein incorporated by reference.

It is to be recognized that the two phosphine groups can be taken together to form a diphosphine chelating ligand. Exemplary diphosphine chelating ligands include, but are not limited to, bis(dicyclohexylphosphino)methane, 1,2-bis(dicyclohexylphosphino)ethane, 1,3-bis(dicyclohexylphosphino)propane, 1,4-bis(dicyclohexylphosphino)butane, and 1,5-bis(dicyclohexylphosphino)pentane. Other suitable diphosphine ligands are exemplified in U.S. Pat. No. 6,455,650, the pertinent portion of which is herein incorporated by reference.

The anionic carboxylate, thiocarboxylate, and dithiocarboxylate ligands defined under Q in combination with the palladium metal center can be unidentate, symmetric bidentate, asymmetric chelating bidentate, asymmetric bridging, or symmetric bridging ligands.

Lewis bases in accordance with the present invention can be any compound that donates an electron pair. The Lewis base can be water or selected from the following type of compounds: alkyl ethers, cyclic ethers, aliphatic or aromatic ketones, primary alcohols, nitriles, cyclic amines especially pyridines and pyrazines, and trialkyl or triaryl phospites.

Exemplary Lewis base ligands include, but are not limited to, water, dimethyl ether, diethyl ether, tetrahydrofuran, dioxane, acetone, benzophenone, acetophenone, methanol, isopropanol, acetonitrile, benzonitrile, tert-butylnitrile, tert-butylisocyanide, xylylisocyanide, pyridine, dimethylaminopyridine, 2,6-dimethylpyridine, 4-dimethylaminopyridine, tetramethylpyridine, 4-methylpyridine, pyrazine, tetramethylpyrazine, triisopropylphosphite, triphenylphosphite, and triphenylphosphine oxide. Phosphines can also be included as exemplary Lewis bases so long as they are added to the reaction medium during the formation of the single component procatalyst of the invention. Examples of Lewis base phosphines include, but are not limited to, triisopropylphosphine, tricyclohexylphosphine, tricyclopentylphosphine, and triphenylphosphine.

The WCA of Formula (X) is selected from borates and aluminates, boratobenzene anions, carborane, halocarborane and phosphaborane anions. Representative borate anions include, but are not limited to, tetrakis(pentafluorophenyl)borate (FABA), tetrakis(3,5-bis(trifluoromethyl)phenyl)borate, and tetrakis(2-fluorophenyl)borate. Other useful weakly coordinating anions, for example other borates and aluminates, boratobenzene anions, carborane, halocarborane and phosphaborane anions, can be found in U.S. Pat. No. 6,445,650, the pertinent portions of which are incorporated herein by reference.

Exemplary salts of weakly coordinating anions are N,N-dimethylanilinium tetrakis(pentafluorophenyl)borate and lithium tetrakis(pentafluorophenyl)borate.2.5 diethyletherate, among others.

The cooligomers containing allyl monomers according to Formulae D and/or E of the present invention can be prepared via standard free radical solution polymerization/oligomerization methods that are well-known by those skilled in the art. For example, the above one or more DRM monomers can be oligomerized or cooligomerized using free radical techniques that are known in the art. Thus, the present invention encompasses a method of making the above-described oligomers according including:

I) forming a monomer mixture comprising one or more of the monomers according to Formulae A, B, C, D or E and if A is not present, E must be included;

II) adding a free radical initiator to the monomer mixture in an amount sufficient to effect polymerization; and III) heating the mixture in II) to a temperature at which the initiator can effect polymerization.

The free radical initiator is used in an effective amount to oligomerize the monomer or comonomer. Generally, the amount of initiator used is about 1% to 20% by weight of the total weight of the one or more monomer used. Alternatively, the weight percent range of initiator is from 2 to 10 or from 4 to 7 percent. Peroxide and azo type free radical initiators are two well-known free-radical initiators. Examples include hydrogen peroxide, benzoyl peroxide, di-tert-butyl peroxide, tert-butyl hydroperoxide, azo-bis(isobutyronitrile) (AIBN).

The oligomerization reaction is performed at any temperature effective to cause free-radical propagation. Typically the reaction temperature is governed by the temperature of decomposition of the free radical initiator. In general, the temperature range used is from about 20° C. to about 200° C. An alternate range is from about 50° C. to about 150° C. or from about 80° C. to about 130° C.

One may optionally carry out the oligomerization in the presence of a solvent to dissolve the one or more monomers or the oligomerization can be carried out in the absence of solvent by mixing the monomers together. Suitable solvents include aliphatics, cycloaliphatics, aromatics, heterocyclics, halogenated aliphatics, halogenated aromatics, and ethers. Specific examples include pentane, hexane, heptane, octane, cyclohexane, benzene, toluene, xylene, mesitylene, ethylbenzene, pyridine, dichloromethane, dichloroethane, chlorobenzene, dichlorobenzene, diethylether, dioxane, and tetrahydrofuran.

Other embodiments of the invention provide photoresist compositions that include the above-described oligomers of polycyclic olefin monomers. A particular embodiment of the invention is directed to photoresist compositions where the oligomers of polycyclic olefin monomers are included as dissolution rate modifiers.

In the photoresist embodiments of the invention, the photoresist composition includes the above-described DRM and a polymeric binder resin, a photoacid generator (PAG), and optionally a suitable spinning solvent, and additives such as base quenchers and sensitizers. Further to this embodiment, the photoresist composition can include base quenchers and sensitizers.

The polymeric resins or binder of the present invention are known to the art and to the literature and are generally commercially available. Such resins or binders include, but are not limited to, addition type polynorbornenes, phenolics, novolacs, polyhydroxy styrene or styrene-acrylate copolymers, acrylate polymers or methacrylate polymers, norbornene-maleic anhydride copolymers, norbornene-maleic anhydride-acrylate terpolymers, norbornene-vinyl ether copolymers, and the like, and combinations thereof.

As previously discussed, embodiments of the invention are directed to positive tone and negative tone photoresist compositions. An embodiment of the present invention provides a negative tone photoresist composition including:

A) a solvent;

B) a photosensitive acid generator (PAG);

C) a crosslinking agent containing functional groups;

D) one or more negative tone imaging polymeric resins containing functional groups that are reactive with the functional groups in the crosslinking agent; and E) the dissolution rate modifiers described above.

The negative tone photoresist compositions of the present invention have a particlurly low optical density (OD), especially at at wavelengths of 193 nm and below.

In an embodiment of the invention, the crosslinking agent (C) of the negative tone photoresist composition is a compound which is capable of reacting with functional groups, as a non-limiting example hydroxyl groups, of the negative tone imaging polymeric resins or binder polymers in (D). Further to this embodiment, the crosslinking agent (C) can be activated by an acid generated by the photoacid generator (B). Examples of suitable crosslinking agents that can be used in (C) include, but are not limited to, compounds containing one or more groups selected from methylol, alkoxyalkyl and carboxymethyl group substituted phenols; methylol, alkoxyalkyl and carboxymethyl group substituted cyclic ureas; methylol, alkoxyalkyl and carboxymethyl group substituted melamines; and methylol, alkoxyalkyl and carboxymethyl group substituted benzoguanine compounds.

In an additional embodiment of the present invention, the photoacid generator (B) is a compound that, upon exposure to radiation, generates a strong acid. Exemplary photoacid generators (B) that can be used in the invention include, but are not limited to, one or more compounds selected from triflates, pyrogallols, onium salts, hexafluoroarsenates, trifluoromethanesulfonates, esters of hydroxyimides, $\alpha,\alpha'$-bis-sulfonyl-diazomethanes, sulfonate esters of nitro-substituted benzyl alcohols and napthoquinone-4-diazides. In this embodiment, the triflates include triphenylsulfonium triflate; the pyrogallols include trimesylate of pyrogallol; and the onium salts includes one or both of triarylsulfonium and diaryliodium hexafluoroantimonates.

An additional embodiment of the invention provides that the solvent (A) generally includes one or more solvents selected from propylene glycol methyl ether acetate, cyclohexanone, butyrolactate, and ethyl lactate.

Suitable negative tone imaging polymers include, but are not limited to, those that contain at least one functional group that is capable of being cured and/or crosslinking with another group and is reactive with the functional group of the crosslinking agent. Suitable functional groups include, but are not limited to, hydroxyl, carboxyl, and epoxy. Exemplary negative tone imaging polymers are those that contain repeat units derived from polycyclic olefin monomers. Suitable negative tone imaging polymer that contain repeat units derived from polycyclic olefin monomers are set forth in U.S. Pat. Nos. 6,121,340 and 6,136,499, the pertinent parts of which are herein incorporated by reference.

An embodiment of the present invention provides a positive tone photoresist composition that includes A) a solvent;

B) a photosensitive acid generator;

C) one or more positive tone imaging polymers including a functional group containing moiety that contains a group that can be cleaved when exposed to radiation, rendering the polymer more soluble to a developer than the unexposed polymer, and D) the above-described dissolution rate modifier.

Exemplary positive tone imaging polymers that can be used in D) include, but are not limited to, polynorbornenes, such as homopolymers of HFANB and as set forth in U.S. Pat. No. 6,136,499 the pertinent parts of which are herein incorporated by reference, suitable monomers encompass polycyclic repeating units which can be free of acid labile groups, although such groups can be utilized; phenolic binders such as phenolic polymers (e.g. hydroxystyrene and carbon and oxygen alkylated derivatives such as those described in U.S. Pat. No. 4,491,628, the relevent portions of which are herein incorporated by reference.); styrene-acrylate copolymers;novolacs, such as resins from an aldehyde such as acetaldehyde or formaldehyde, with a phenol such as phenol itself, or phenol substituted with 1 or 2 alkyl groups of 1 to 9 carbon atoms each; such as those described in U.S. Pat. No. 5,372,912, the pertinent protions of which are herein incorporated by reference; homopolymers or copolymers of acrylate or methacrylate where the ester portion is an alkyl having from 1 to about 12 carbon atoms such as ethyl acrylate, butyl acrylate, 2-ethylhexyl acrylate and the like and the various analogous alkyl methacrylate monomers; copolymers of norbornene-maleic anhydride or terpolymers of norbornene-maleic anhydride-acrylate as set forth in U.S. Pat. No. 5,843,624, the relevent portions of which are incorporated herein by reference.

Suitable PAGs include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, $\alpha,\alpha'$-bis-sulfonyl-diazomethanes, sulfonate esters of nitro-substituted benzyl alcohols and napthoquinone-4-diazides. Other suitable PAGs are disclosed in Reichmanis et al., Chem. Mater. 3, 395, (1991). Compositions containing triarylsulfonium or diaryliodonium salts can be used because of their sensitivity to deep UV light (193 to 300 nm) and very high resolution images. In particular embodiments of the invention, the salts are the unsubstituted and symmetrically or unsymmetrically substituted diaryliodium or triarylsulfonium salts. The PAG component comprises from about 1 to about 100, in some cases from about 1.25 to about 50, and in other cases from about 1.5 to about 5 parts by weight based upon 100 parts by weight of the polymeric binder or resin.

Suitable spinning solvents include, but are not limited to, PGMEA (propylene glycol methylether acetate), ethyl lactate, cyclohexanone, and the like.

Suitable base quenchers include, but are not limited to, tetramethylammonium hydroxide, triethanolamine, triisopropylamine, N-methylpyrrolidone and the like. The base quencher additive can improve photoresist resolution and image profiles. The photoresist compositions of the present invention optionally contain a sensitizer capable of sensitizing the photoacid generator to longer wavelengths ranging from mid-UV to visible light. Depending on the intended application, such sensitizers include polycyclic aromatics such as pyrene and perlene. The sensitization of photoacid generator is well-known and is described in U.S. Pat. Nos. 4,250,053; 4,371,605; and 4,491,628, the relevent portions of which are incorporated herein by reference. The invention is not limited to a specific class of sensitizer or photoacid generator.

Another embodiment of the invention is directed to a method of generating an image (positive or negative tone resist image) on a substrate. The method includes:

(a) coating a substrate with a film containing a negative tone photoresist composition or a positive tone photoresist composition described above to form a film;

(b) imagewise exposing the film to radiation to form an image;

(c) post exposure baking of the film; and (d) developing the image.

In an aspect of this embodiment, the substrate includes one or more of silicon, ceramics, and polymers. In a further aspect, the film is coated on the substrate in (a) using one or more methods selected from spin coating, spray coating, and doctor blading. Additionally, this embodiment can provide that before the film has been exposed to radiation in (b), the film is heated to from 90° C. to 150° C. for from 30 seconds to 5 minutes. Further, the film can be imagewise exposed from a radiation source selected from mercury lamps, mercury/xenon lamps, xenon lamps, argon fluoride lasers, krypton fluoride lasers, fluorine lasers, x-rays and electron beams. In a particular embodiment the film is imagewise exposed at a wave length of from 90 nm to 514 nm. In another embodiment, after the film has been exposed to radiation, the film can be heated to a temperature of from 90° C. to 150° C. for from 30 seconds to 5 minutes.

An embodiment of the invention provides an integrated circuit assembly method encompassing:

(a) coating a substrate with the above-described positive tone or negative tone photoresist composition;

(b) imagewise exposing the film to radiation;

(c) post exposure baking of the film (d) developing the image to expose the substrate; and (e) forming the circuit in the developed film on the substrate.

Further, this embodiment extends to an integrated circuit chip, multichip module, or circuit board including the integrated circuit provided by the above-described method. In a further embodiment, the image is developed with a solvent. Suitable solvents that can be used to develop the present negative tone images generally include propylene glycol methyl ether acetate, cyclohexanone, butyrolactate, and ethyl lactate. In some embodiments, an aqueous base is a suitable solvent. Suitable solvents that can be used to develop the present positive tone images include, but are not limited to, an aqueous base, in many cases an aqueous base without metal ions such as tetramethyl ammonium hydroxide or choline. The composition of the present invention provides positive images with high contrast and straight walls. The dissolution property of the composition of the present invention can be varied by simply varying the composition of the polymer.

After the substrate has been exposed, circuit patterns can be formed in the exposed areas by coating the substrate with a conductive material such as conductive metals by art-known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p- or n-doped circuit transistors. Other means for forming circuits are well known to those skilled in the art.

The following examples are for illustrative purposes and are not intended to limit the invention in any way. Ratios of repeating units incorporated into the polymer backbones are given in molar percent. All molecular weight determinations were made using gel permeation chromatography (GPC) in THF using poly(styrene) standards.

COMPARATIVE EXAMPLE 1

Dichloroethane (90 mL) and t-butylester of 5-norbornene-2-carboxylic acid (10.0 g, 0.0515 mol) were placed into a reactor. The solution was sparged with nitrogen. A dichloroethane solution (1-2 mL) of [($\eta^3$-crotyl)nickel(1,5-cyclooctadiene)]hexafluorophosphate (0.0095 g, 0.026 mmol) and (2-methoxyphenyl)diphenylphosphine (0.076 g, 0.026 mmol) was added. After 2 hours, 1 mL of methanol was added to the reactor. GC analysis of the reaction mixture showed that only unreacted monomer and solvent remained. An aliquot of the reaction mixture was allowed to evaporate at 60° C. overnight after which time no material remained. This examples shows that in the absence of ethylene, nickel containing catalyst, and the appropriate hemilabile, chelating ligand, no oligomerization occurs.

SYNTHESIS EXAMPLE 1

Dichloroethane (90 mL) and t-butylester of 5-norbornene-2-carboxylic acid (10.0 g, 0.0515 mol) were placed into a pressure reactor. The solution was sparged with nitrogen. The solution was then sparged with ethylene and then pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0095 g, 0.026 mmol) and and (2-methoxyphenyl)diphenylphosphine (0.0076 g, 0.026 mmol) was added, then the reactor was immediately repressurized to 50 psig. The mixture exothermed from 19° C. to 31° C. After 2 hours, 1 mL of methanol was added to the reaction mixture. GC analysis of the reaction mixture showed that no monomer remained. Several peaks at higher retention times were observed consistent with formation of higher molecular weight oligomers. An aliquot of the reaction mixture was allowed to evaporate at 60° C. overnight after which time a viscous, clear liquid remained. Solvent was then removed from the reaction mixture by rotary evaporation. GPC analysis showed a bimodal distribution, approximately 24 area percent with Mw=460 and Mn=444 and 76 area percent with Mw=217 and Mn=205. $^1$H NMR analysis of this sample showed peaks in the aliphatic region of the spectrum: approximately 2.7 to 0.9 ppm (38 H). Two peaks were also present in the olefinic region of the spectrum, 5.80 (br s, 1H) and 4.92 (br m, 2H), consistent with the presence of a vinyl group attached to t-butylester of 5-norbornene carboxylic acid. The field desorption mass spectrum of this sample showed two major peaks due to the codimer and cotrimer of ethylene and t-butylester of 5-norbornene carboxylic acid: (ethylene)(t-butylester of 5-norbornene carboxylic acid) and (ethylene)(t-butylester of 5-norbornene carboxylic acid)$_2$.

SYNTHESIS EXAMPLE 2

The method of Synthesis Example 1 was repeated except 20 psig ethylene was used instead of 50 psig. In this case, an exotherm of only 1° C. was observed. GC analysis of the reaction mixture showed that while oligomers formed, a considerable amount of unreacted monomer was present. Solvent was then removed from the reaction mixture by rotary evaporation. GPC analysis of the nonvolatile, clear liquid showed results essentially identical to that found in Synthesis Example 1: a bimodal peak with 20 area percent at higher molecular weight with the remaining at lower molecular weight.

SYNTHESIS EXAMPLE 3

Synthesis Example 1 was repeated except 90 psig ethylene was used instead of 50 psig. In this case an exotherm of 12° C. was observed. GC analysis of the reaction mixture showed that only oligomers were present; no unreacted monomer was observed. Solvent was then removed from the reaction mixture by rotary evaporation. GPC analysis of the nonvolatile, clear liquid showed results essentially identical to that found in Synthesis Examples 1 and 2: a bimodal peak with 23 area percent at higher molecular weight with the remaining at lower molecular weight.

SYNTHESIS EXAMPLE 4

Under Synthesis Example 1 conditions, dichloroethane (90 mL) and 2-oxocyclopentyl ester of 5-norbornene-2-carboxylic acid (11.1 g, 0.0500 mol) were placed into a pressure reactor. The solution was sparged with nitrogen. The solution was then sparged with ethylene and then pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.073 g, 0.025 mmol) was added, then the reactor was immediately repressurized to 50 psig. The reaction mixture exothermed 15° C. After 2 hours, 1 mL of methanol was added to the reaction mixture. Solvent was then removed from the reaction mixture by rotary evaporation to give about 12 g of a clear, viscous liquid. GPC analysis showed a bimodal distribution: Mw=341 and 168. Field desorption mass spectrometry of the liquid showed two major peaks due to the codimer (ethylene)(2-oxocyclopentyl ester of 5-norbornene-2-carboxylic acid), the cotrimer (ethylene)(2-oxocyclopentyl ester of 5-norbornene-2-carboxylic acid)$_2$, and small amounts of the cotetramer (ethylene)(2-oxocyclopentyl ester of 5-norbornene-2-carboxylic acid)$_3$. $^1$H NMR analysis of this liquid show the presence of vinyl groups at 5.70 (m, 1H) and 4.91 (m, 2H) ppm.

SYNTHESIS EXAMPLE 5

Under the conditions of Synthesis Example 1, dichloroethane (90 mL) and 1-methylcyclopentyl ester of 5-norbornene-2-carboxylic acid (11.0 g, 0.0500 mol) were placed into a pressure reactor. The solution was sparged with nitrogen. The solution was then sparged with ethylene and then pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.0073 g, 0.025 mmol) was added, then the reactor was immediately repressurized to 50 psig. The reaction mixture exothermed 2° C. After 2 hours, 1 mL of methanol was added to the reaction mixture. GC analysis of the reaction mixture showed the presence of unreacted monomer as well as oligomers (peaks were observed at higher retention times).

SYNTHESIS EXAMPLE 6

Under the conditions of Synthesis Example 1, dichloroethane (90 mL) and 5-[(2,3-epoxypropoxy)methyl]-2-norbornene (9.0 g, 0.050 mol) were placed into a pressure reactor. The solution was sparged with nitrogen. The solution was then sparged with ethylene and then pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.0073 g, 0.025 mmol) was added, then the reactor was immediately repressurized to 50 psig. The reaction mixture exothermed 20° C. After 2 hours, 1 mL of methanol was added to the reaction mixture. GC analysis of the reaction mixture showed the absence of unreacted monomer and peaks at higher retention times due to the formation of oligomers. Solvent was then removed from the reaction mixture by rotary evaporation to give about 10 g of a clear, viscous liquid. GPC analysis of the liquid showed a trimodal distribution: peak molecular weights at 385, 286 and 168. Field desorption mass spectrometry of the liquid showed two major peaks due to the codimer (ethylene)(5-[(2,3-epoxypropoxy)methyl]-2-norbornene), the cotrimer (ethylene)(5-[(2,3-epoxypropoxy)methyl]-2-norbornene)$_2$. $^1$H NMR analysis of this liquid show the presence of vinyl groups at 5.77 (m, 1H) and 4.90 (m, 2H) ppm.

SYNTHESIS EXAMPLE 7

Under the conditions of Synthesis Example 1, dichloroethane (90 mL) and 5-(2-hydroxy-2,2-bistrifluoromethyl)ethyl-2-norbornene (13.7 g, 0.050 mol) were placed into a pressure reactor. The solution was sparged with nitrogen. The solution was then sparged with ethylene and then pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.0073 g, 0.025 mmol) was added, and then the reactor was immediately repressurized to 50 psig. The reaction mixture exothermed 24° C. After 2 hours, 1 mL of methanol was added to the reaction mixture. GC analysis of the reaction mixture showed the absence of unreacted monomer and peaks at higher retention times due to the formation of oligomers. Solvent was then removed from the reaction mixture by rotary evaporation to give about 13 g of a clear, viscous liquid. GPC analysis of the liquid showed a bimodal distribution: peak molecular weights at 723 and 351. Field desorption mass spectrometry of the liquid showed two major peaks due to the codimer (ethylene)(5-(2-hydroxy-2,2-bistrifluoromethyl)ethyl-2-norbornene) and the cotrimer (ethylene)(5-(2-hydroxy-2,2-bistrifluoromethyl)ethyl-2-norbornene)$_2$. $^1$H NMR analysis of this liquid show the presence of vinyl groups at 5.75 (m, 1H) and 4.90 (m, 2H) ppm.

SYNTHESIS EXAMPLE 8

Under the conditions of Synthesis Example 1, dichloroethane (90 mL) and 2-(trifluoromethyl)-1,1-dimethylethyl ester of 5-norbornene-2-carboxylic acid (14.3 g, 0.050 mol) were placed into a pressure reactor. The solution was sparged with nitrogen. The solution was then sparged with ethylene and pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.0073 g, 0.025 mmol) was added, and then the reactor was immediately repressurized to 50 psig. The reaction mixture exothermed 39° C. After 2 hours, 1 mL of methanol was added to the reaction mixture. GC analysis of the reaction mixture showed the absence of unreacted monomer and peaks at higher retention times due to the formation of oligomers. Solvent was then removed from the reaction mixture by rotary evaporation to give about 16 g of a clear, viscous liquid. GPC analysis of the liquid showed a bimodal distribution: peak molecular weights at 309 and 153. Field desorption mass spectrometry of the liquid showed two major peaks due to the codimer (ethylene)(2-(trifluoromethyl)-1,1-dimethylethyl ester of 5-norbornene-2-carboxylic acid) and the cotrimer (ethylene)(2-(trifluoromethyl)-1,1-dimethylethyl ester of 5-norbornene-2-carboxylic acid)$_2$. $^1$H NMR analysis of this liquid show the presence of vinyl groups at 5.73 (m, 1H) and 4.96 (m, 2H) ppm.

SYNTHESIS EXAMPLE 9

Under Synthesis Example 1 conditions, dichloroethane (90 mL) and 5-norbornene-2-methanol acetate (8.3 g, 0.050 mol) were placed into a pressure reactor. The solution was sparged with nitrogen. The solution was then sparged with ethylene and pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.0092 g, 0.025 mmol) and (2-methoxyphenyl)diphenylphosphine (0.0073 g, 0.025 mmol) was added, then the reactor was immediately repressurized to 50 psig. The reaction mixture exothermed 22° C. After 2 hours, 1 mL of methanol was added to the reaction mixture. GC analysis of the reaction mixture showed the absence of unreacted monomer and peaks at higher retention times due to the formation of oligomers. Solvent was then removed from the reaction mixture by rotary evaporation to give about 10 g of a clear, viscous liquid. GPC analysis of the liquid showed a bimodal distribution: peak molecular weights at 322 and 164. Field desorption mass spectrometry of the liquid showed two major peaks due to the codimer (ethylene)(5-norbornene-2-methanol acetate) and the cotrimer (ethylene)(5-norbornene-2-methanol acetate)$_2$. $^1$H NMR analysis of this liquid show the presence of vinyl groups at 5.76 (m, 1H) and 4.90 (m, 2H) ppm.

SYNTHESIS EXAMPLE 10

Under the conditions of Synthesis Example 1, dichloroethane (300 mL), t-butyl ester of 5-norbornene-2-carboxylic acid (17.7 g, 0.091 mol), and 5-(2-hydroxy-2,2-bistrifluoromethyl)ethyl-2-norbornene (25.0 g, 0.091 mol) were placed into a pressure reactor. The solution was sparged with nitrogen. The solution was then sparged with ethylene and pressurized to 50 psig and allowed to equilibrate at room temperature for 10 min. The pressure was then released, a dichloroethane solution of [($\eta^3$-crotyl)nickel(1,5-cyclooctadiene)]hexafluorophosphate (0.033 g, 0.091 mmol) and (2-methoxyphenyl)diphenylphosphine (0.026 g, 0.091 mmol) was added, then the reactor was immediately repressurized to 50 psig. The reaction mixture exothermed 20° C. After 2 hours, 1 mL of methanol was added to the reaction mixture. GC analysis of the reaction mixture showed the absence of unreacted monomer and peaks at higher retention times due to the formation of oligomers. Solvent was then removed from the reaction mixture by rotary evaporation to give about 48 g of a clear, viscous liquid. GPC analysis of the liquid showed a trimodal distribution: peak molecular weights at 563, 362 and 214. Field desorption mass spectrometry of the liquid showed peaks due to the following oligomers: (ethylene)(t-butylester of 5-norbornene-2-carboxylic acid), (ethylene)(5-(2-hydroxy-2,2-bistrifluoromethyl)ethyl-2-norbornene), (ethylene)(t-butylester of 5-norbornene-2-carboxylic acid)$_2$, (ethylene)(t-butylester of 5-norbornene-2-carboxylic acid)(5-(2-hydroxy-2,2-bistrifluoromethyl)ethyl-2-norbornene), (ethylene)(5-(2-hydroxy-2,2-bistrifluoromethyl)ethyl-2-norbornene)$_3$, (ethylene)(t-butyl ester of 5-norbornene-2-carboxylic acid)$_2$(5-(2-hydroxy-2,2-bistrifluoromethyl)ethyl-2-norbornene), (ethylene)(t-butylester of 5-norbornene-2-carboxylic acid)(5-(2-hydroxy-2,2-bistrifluoromethyl)ethyl-2-norbornene)$_2$. $^1$H NMR analysis of this liquid showed the presence of vinyl groups at 5.76 (m, 1H) and 4.90 (m, 2H) ppm.

SYNTHESIS EXAMPLE 11

To the liquid obtained from Example 10 was added 144 g of glacial acetic acid (2.4 mol) and 141 mL of 30% hydrogen peroxide (1.25 mol). The mixture was heated to 60° C. for 6 hours. The mixture was then cooled and transferred to a separatory funnel. After standing overnight, two layers appeared. The organic layer was separated from the aqueous phase. To the aqueous phase was added 50 mL of methylene chloride and 150 mL of water. The organic layer was separated and the aqueous phase was extracted once again with methylene chloride (50 mL). The organic phase was then washed several times with water. The solvent was then removed from the organic phase by rotary evaporation to yield a clear, viscous liquid. Yield 38 g. GPC of the liquid exhibited a multimodal curve with an average Mw of 457. $^1$H NMR analysis of this liquid showed essentially no vinyl end groups present. Field desorption mass spectrometry showed peaks due to epoxides, diols, and acetate, alcohol derivatives of the oligomer products found in Example 9.

SYNTHESIS EXAMPLE 12

The liquid oligomer from Synthesis Example 11 (11.24 g) was dissolved in THF (50 mL, anhydrous). To this solution was added NaH powder (1.0 g), portion-wise. Chloromethyl methyl ether (2.13 g) was syringed into the solution. The reaction mixture was then stirred overnight. The reaction mixture was extracted into ethyl acetate (100 mL) from water (100 mL). The organic phase was washed with water (2×100 mL) and the solvent was removed under vacuum from the organic phase to yield the methoxymethyl protected oligomer. IR analysis of the product shows that the ν(OH) stretch of the product was much diminished when compared to the starting material consistent with protection of the alcohol functionality. Two new resonances are observed in the $^1$H NMR spectrum (4.92 and 3.45 ppm) due to the —O—CH$_2$—O—CH$_3$ protecting group. GPC of the product exhibited a multimodal curve with an average Mw of 509.

SYNTHESIS EXAMPLE 13

The liquid oligomer from Synthesis Example 11 (11.66 g) was dissolved in THF (50 mL, anhydrous). To this solution was added NaH powder (1.2 g), portion-wise. Bromo, t-butylacetate (5.36 g) was syringed into the solution. The reaction mixture was then stirred overnight. The reaction mixture was extracted into ethyl acetate (100 mL) from water (100 mL). The organic phase was washed with water (2×100 mL) and the solvent was removed on by rotary evaporation. The final product was further dried under vacuum to yield the tert-butoxy carbonyl methyl protected oligomer. IR analysis of the product shows that the ν(OH) stretch of the starting material was much diminished when compared to the starting material and two ν(CO) stretches were observed in the 1700 cm$^{-1}$ region of the spectrum consistent with the presence of the t-butylester functionality from the starting material and the t-butoxycarbonyl methyl functionality derived from protection of the alcohol. Two t-butyl groups are observed $^1$H NMR spectrum (1.47 and 1.45 ppm). GPC of the product exhibited a multimodal curve with an average Mw of 593.

SYNTHESIS EXAMPLE 14

Dichloroethane (300 mL) and 2-(trifluoromethyl)-1,1-dimethylethyl ester of 5-norbornene-2-carboxylic acid (52.0 g, 0.186 mol) were placed into a pressure reactor. The solution was sparged with nitrogen. The solution was then sparged with ethylene and pressurized to 50 psig and allowed to equilibrate at room temperature for 10 min. The pressure was then released, a dichloroethane solution of [(η$^3$-crotyl)nickel(1,5-cyclooctadiene)]hexafluorophosphate (0.033 g, 0.091 mmol) and (2-methoxyphenyl)diphenylphosphine (0.026 g, 0.091 mmol) was added, then the reactor was immediately repressurized to 50 psig. After 2 hours, 1 mL of methanol was added to the reaction mixture. Solvent was then removed from the reaction mixture by rotary evaporation to give about 58 g of a clear, viscous liquid. $^1$H NMR analysis of this liquid showed the presence of vinyl groups at 5.73 (m, 1H) and 4.96 (m, 2H) ppm.

To the liquid was added 174 g of glacial acetic acid (2.9 mol) and 170 mL of 30% hydrogen peroxide (1.5 mol). The mixture was heated to 60° C. for 6 hours. The mixture was allowed to stand overnight after addition of 150 mL of water in a separatory funnel. An additional 50 mL of water was added. Methylene chloride (50 mL) was added and the mixture separated into 2 layers. The organic layer was separated and washed with additional water (5×500 mL). The organic layer was separated and rotovaped to remove solvent. A clear, viscous liquid resulted. Yield 45.8 g. GPC of the liquid exhibited a bimodal distribution with peak molecular weights at 420 and 283. $^1$H NMR analysis of this liquid showed a substantial decrease in the intensity of the vinyl end groups relative to the starting material. Field desorption mass spectrometry showed major peaks due to the diol of (ethylene)(2-(trifluoromethyl)-1,1-dimethylethyl ester of 5-norbornene-2-carboxylic acid) and the acetate, alcohol of (ethylene)(2-(trifluoromethyl)-1,1-dimethylethyl ester of 5-norbornene-2-carboxylic acid).

SYNTHESIS EXAMPLE 15

Dichloroethane (300 mL) and 5-(2-hydroxy-2,2-bistrifluoromethyl)ethyl-2-norbornene (60.0 g, 0.219 mol) were placed into a pressure reactor. The solution was sparged with nitrogen. The solution was then sparged with ethylene and pressurized to 50 psig and allowed to equilibrate at room temperature for 10 min. The pressure was then released, a dichloroethane solution of [(η$^3$-crotyl)nickel(1,5-cyclooctadiene)]hexafluorophosphate (0.033 g, 0.091 mmol) and (2-methoxyphenyl)diphenylphosphine (0.026 g, 0.091 mmol) was added, and then the reactor was immediately repressurized to 50 psig. After 2 hours, 1 mL of methanol was added to the reaction mixture. Solvent was then removed from the reaction mixture by rotary evaporation to give about 61 g of a clear, viscous liquid.

To 57 g of the liquid obtained above was added 257 g of glacial acetic acid (4.28 mol) and 485 mL of 30% hydrogen peroxide (4.28 mol). The mixture was heated to 60° C. for 6 hours. The mixture was allowed to stand overnight after addition of 150 mL of water in a separatory funnel. Water (50 mL) was added. Methylene chloride (50 mL) was added and the mixture separated into 2 layers. The organic layer was separated and washed with additional water (5×500 mL). The organic layer was separated and rotovaped to remove solvent. A clear, viscous liquid resulted. Yield 45.8 g. GPC of the liquid exhibited a bimodal distribution with peak molecular weights at 420 and 283. $^1$H NMR analysis of this liquid showed a substantial decrease in the intensity of the vinyl end groups relative to the starting material. Mass spectrometry showed major peaks due to the diol of (ethylene)(2-(trifluoromethyl)-1,1-dimethylethyl ester of 5-norbornene-2-carboxylic acid) and the acetate, alcohol of (ethylene)(2-(trifluoromethyl)-1,1-dimethylethyl ester of 5-norbornene-2-carboxylic acid).

SYNTHESIS EXAMPLE 16

The liquid oligomer from Synthesis Example 15 (11.0 g) was dissolved in THF (50 mL, anhydrous). This solution was added to NaH (1.06 g) dissolved in THF (10 mL). An additional 0.2 g of NaH was added to ensure complete deprotonation. Chloromethyl methyl ether (2.13 g) was syringed slowly into this solution. The reaction mixture temperature climbed to 50° C. The reaction mixture was then stirred overnight. 50 mL of water was added to the reaction mixture and the organics were extracted into ethyl acetate/THF. The organic phase was washed with water and the solvent was removed under vacuum from the organic phase to yield the methoxymethyl protected oligomer. Yield 12.6 g. IR analysis of the product shows that the v(OH) stretch of the product was much diminished when compared to the starting material consistent with protection of the alcohol functionality. Two new resonances are observed in the $^1$H NMR spectrum (5.13 and 3.46 ppm) due to the —O—CH$_2$—O—CH$_3$ protecting group. GPC of the product exhibited a multimodal curve with an average Mw of 751.

SYNTHESIS EXAMPLE 17

Crotyl nickel bromide dimer was prepared by cooling crotyl bromide (4.7 g, 0.035 mol) in 150 mL of toluene to −78° C. Butadiene (8.7 g, 0.035 mol) was condensed into the flask. This mixture was transferred to a cold (−78° C.) toluene solution of Ni(1.5-cyclooctadiene)$_2$ (9.6 g, 0.035 mol). The mixture became deep red. After 2 hours at −78° C., the mixture was warmed to room temperature and stirred for 3 more hours. Slow evaporation of the solvent yielded red needles. The crystals were bathed with pentane (1×20 mL) at −78° C. and isolated by filtration. Yield 2.4 g (93%). $^1$H NMR (C$_6$D$_6$): 4.60 (m, 1H), 2.66 (d, 1H), 2.44 (m, 1H) (d, 1H), 0.61 (d, 3H).

The FABA salt of nickel complex was prepared by dissolving ($\eta^3$-crotyl)nickel bromide dimer (1.5 g, 0.0039 mol) In THF (70 mL). To this solution was added 2.26 g of (2-methoxyphenyl)diphenylphosphine (00774 mol). The solution was cooled to 0° C. and a THF (30 mL) solution of silver tetrakis(pentafluorophenyl)borate (7.51 g, 0.00774 mol) was added. The solution turned from red to brown-orange. After 10 min, the solution was warmed to room temperature. The mixture was filtered to remove AgBr. Solvent was then removed under vacuum. The resulting foam was stirred with 30 mL of pentane then the volatiles were removed under vacuum to give a free-flowing powder. Yield 8.5 g.

The monomer, t-butyl ester of 5-norbornene-2-carboxylic acid (9.69 g, 0.0500 mol) was dissolved in 60 mL of toluene in a pressure reactor. The solution was charged with 50 psig ethylene in order to saturate the solution. The excess ethylene was then vented and the nickel complex isolated above (0.0329 g) in 20 mL of toluene was added to the monomer mixture. The ethylene pressure was immediately increased to 50 psig. The reaction was allowed to run for 4 hours. GC analysis of the reaction mixture showed the formation of oligomers. Complete conversion was obtained since no unreacted monomer was observed.

The oligomerization was repeated in 1,2-dichloroethane (90 mL). GC analysis of the reaction mixture showed the presence of oligomers as well as some unreacted monomer.

SYNTHESIS EXAMPLE 18

The monomer, t-butyl ester of 5-norbornene-2-carboxylic acid (9.69 g, 0.0500 mol) was dissolved in 1,2-dichloroethane (90 mL) in a pressure reactor. The solution was charged with 50 psig ethylene in order to saturate the solution. The excess ethylene was then vented and a mixture of [($\eta^3$-crotyl)nickel (1,5-cyclooctadiene)]hexafluorophosphate (0.0096 g, 0.026 mmol) and R-(+)-(2'-methoxy[1,1'-binaphthalene]-2-yl) diphenylphosphine (0.00121 g, 0.026 mmol) in 1,2-dichloroethane (20 mL) was added to the monomer mixture. The ethylene pressure was immediately increased to 50 psig. The reaction was allowed to continue for 3 hours. GC analysis of the reaction mixture showed the formation of oligomers. Unreacted monomer was also observed.

SYNTHESIS EXAMPLE 19

The above example was repeated, except tri(o-methoxyphenyl)phosphine (9.16 mg, 0.026 mmol) was substituted for (2'-methoxy[1,1'-binaphthalene]-2-yl)diphenylphosphine and the reaction was run for 4 hours. GC analysis of the reaction mixture showed only oligomers present. Complete conversion was obtained since unreacted monomer was not observed.

SYNTHESIS EXAMPLE 20

The above example was repeated, except tri(p-methoxyphenyl)phosphine was used and the reaction was run for 4 hours. GC analysis of the reaction mixture showed oligomers present as well as some unreacted monomer.

SYNTHESIS EXAMPLE 21

The above example was repeated, except tri(m-methoxyphenyl)phosphine was used and the reaction was run for 24 hours. GC analysis of the reaction mixture showed oligomers present as well as some unreacted monomer.

SYNTHESIS EXAMPLE 22

The monomer, 5-(2-hydroxy-2,2-bistrifluoromethyl) ethyl-2-norbornene (13.1 g, 0.048 mol) was dissolved in 1,2-dichloroethane (70 mL) in a pressure reactor. The solution was charged with 50 psig ethylene in order to saturate the solution. The excess ethylene was then vented and a mixture of [($\eta^3$-crotyl)nickel(1,5-cyclooctadiene)]hexafluorophosphate (0.0096 g, 0.026 mmol) and tri(o-methoxyphenyl) phosphine (9.16 mg, 0.026 mmol) in 1,2-dichloroethane (20 mL) was added to the monomer mixture. The ethylene pressure was immediately increased to 50 psig. The reaction was allowed to continue for 5 hours. GC analysis of the reaction mixture showed the formation of oligomers. Unreacted monomer was also observed.

SYNTHESIS EXAMPLE 23

The monomers, α,α-bis(trifluoromethyl)bicyclo[2.2.1]hept-5-ene-2-ethanol (HFANB) (5.0 g, 0.018 mol) and 1-bis(trifluoromethyl)-3-buten-1-ol (Allyl HFA) (3.8 g, 0.018 mol), and initiator, di-tert-butylperoxide (0.51 g, 0.0034 mol), were mixed in a 3-necked flask equipped with a condenser, a nitrogen purge, and stirbar. The mixture was heated to 130° C. overnight. The mixture was cooled to room temperature. Excess monomer was removed under vacuum. Field ionization mass spectrometry of the resulting product was consistent with the formation of oligomers containing both comonomers up to tetramers. Mw was 1740, Mn was 1350, and Mw/Mn was 1.29. Glass transition temperature (Tg) of the resulting material was determined to be about 43° C. by differential scanning calorimetry (2nd heat, 10° C./min).

SYNTHESIS EXAMPLE 24

The comonomers, HFANB (20 g, 0.073 mol) and Allyl HFA(15.2 g, 0.0729 mol), and initiator, di-tert-butyl peroxide (2.03 g, 0.00139 mol), were mixed in a 3-necked flask equipped with a condenser, a nitrogen purge, and stirbar. The mixture was heated to 130° C. overnight. The mixture was cooled to room temperature. Excess monomer was removed under vacuum. A glassy product resulted. Yield 21 g (60%). Mw was 1790, Mn was 1540, and Mw/Mn was 1.16.

SYNTHESIS EXAMPLE 25

About 10 g of the cooligomer isolated from Synthesis Example 24 was dissolved in 50 g of dry THF under nitrogen. In a separate vial, di-tert-butyldicarbonate (12.9 g, 0.0592 mol) was dissolved in dry THF and sparged with nitrogen. Sodium hydride (1.3 g, 0.054 mol) was placed in a 3-necked flask (equipped with a nitrogen inlet and stirbar) under nitrogen along with dry THF (150 mL) and cooled to −78° C. To this mixture was added the cooligomer solution. This mixture was allowed to stir for 1 hour. Then the di-tert-butyldicarbonate solution was added dropwise. The mixture was warmed to room temperature and stirred overnight. The reaction mixture was washed with water, and then twice with a brine solution, then finally another water wash. The organic layer was reduced by rotovaporation and precipitated into hexane. The resulting powder was collected filtration funnel, and dried in a vacuum oven at 50° C. until until a constant weight was obtained. IR analysis of the protected oligomer shows no ν(OH) stretches in the 3300 to 3700 cm$^{-1}$ region of the spectrum and a strong ν(CO) stretch around 1770 cm$^{-1}$ indicative of complete substitution of the hydroxyl groups by a tert-butyl carbonate group. Mw was 1900, Mn was 1580, and Mw/Mn was 1.20.

SYNTHESIS EXAMPLE 26

The monomers, HFANB (75 g, 0.27 mol) and Allyl HFA (56.9 g, 0.274 mol), and initiator, di-tert-butylperoxide (7.61 g, 0.0521 mol), were mixed in a 3-necked flask equipped with a condenser, a nitrogen purge, and stirbar. The mixture was heated to 130° C. overnight. The mixture was cooled, the flask was equipped with a distillation head and excess monomer was distilled from the reaction mixture 130° C. under vacuum. Mw was 1820, Mn was 1590, Mw/Mn was 1.14. The oligomeric product was determined to contain about 57 mole percent Allyl HFA and 43 mole percent HFANB by 13C NMR spectrometry.

SYNTHESIS EXAMPLE 27

Sodium hydride (1.1 g, 0.046 mol) was added portion-wise under nitrogen to a 0° C. THF (60 mL) solution of 10 g of the co-oligomer isolated from Synthesis Example 26. Gas evolution immediately occurred. After completion of addition, the solution was allowed to warm to room temperature over 1 hour. To this solution was added chloromethylmethyl ether (3.6 g, 0.045 mol). The reaction was stirred overnight and then poured into water. An emulsion formed. Ethyl acetate (200 mL) was added to the emulsion yielding two phases. The organic layer was separated and washed three times with water. The organic layer was separated from the water layer and volatiles were removed from the organic layer by rotoevaporation to give a semi-liquid material. Yield 10 g (83%). Mw was 1820, Mn was 1600, and Mw/Mn was 1.14.

SYNTHESIS EXAMPLE 28

The monomers, HFANB (9.9 g, 0.036 mol) and Allyl HFA (7.5 g, 0.036 mol), t-butyl ester of 5-norbornene carboxylic acid (7 g, 0.036 mol) and initiator, di-tert-butylperoxide (1.51 g, 0.0103 mol), were mixed in a 3-necked flask equipped with a condenser, a nitrogen purge, and stirbar. The mixture was heated to 130° C. overnight. The next day, the volatiles from the reaction mixture were removed by short path distillation under vacuum and heating to 130° C. The mixture was left under vacuum at 120° C. overnight. Mw was 2120, Mn was 1440, and Mw/Mn was 1.47. The oligomeric product was determined to contain 28 mole percent t-butyl ester of 5-norbornene carboxylic acid, 18 mole percent HFANB, 45 mole percent Allyl HFA, and 9 mole percent 5-norbornene carboxylic acid by 13C NMR spectrometry.

SYNTHESIS EXAMPLE 29

Sodium hydride (0.80 g, 0.033 mol) was added portion-wise under nitrogen to an anhydrous THF (30 mL) solution of 5.5 g of the oligomer isolated from Example 28. After completion of addition, the solution was stirred for an additional 30 min. To this solution was added chloromethylmethyl ether (2.8 g, 0.035 mol). The reaction was stirred overnight and then poured into water along with 150 mL of ethylacetate. The organic phase was separated and washed three times with water. The organic layer was separated from the water layer and volatiles were removed from the organic layer by rotoevaporation and then finally dried at 80° C. under vacuum for 18 hours. Yield 4.8 g.

SYNTHESIS EXAMPLE 30

The monomers, HFANB (6.86 g, 0.0250 mol) and Allyl HFA(10.4 g, 0.0500 mol), 5-norbornene carboxylic acid (3.45 g, 0.0250 mol) and initiator, di-tert-butyl peroxide (1.40 g, 0.0100 mol), were mixed in and heated to 130° C. After 16 hours, an orange, viscous liquid resulted. Volatiles were removed by heating the mixture to 100° C. under vacuum. Yield 13.5 g (61%). Mw was 2130, Mn was 1310, and Mw/Mn was 1.62. The oligomeric product was determined to contain about 29 mole percent 5-norbornene carboxylic acid, 15 mole percent HFANB, 56 mole percent Allyl HFA by 13C NMR spectrometry.

SYNTHESIS EXAMPLE 31

Sodium hydride (0.56 g) was slurried in dry THF under nitrogen and was cooled with dry ice. To this slurry was added dropwise an oligomer solution of vinyl addition HFANB (5.1 g, Mw=1670, Mw/Mn=1.19) in dry, deareated THF. The mixture was allowed to stir for one hour after which di-tert-butyl carbonate (5.6 g) was added in as a solution in dry, deareated THF (20 g) dropwise. The mixture was allowed to warm to room temperature overnight. The reaction mixture was washed with water, and then twice with a brine solution, then finally another water wash. The organic layer was reduced by rotovaporation and precipitated into hexane. The resulting powder was collected by filtration and dried in a vacuum oven at 50° C. until a constant weight was obtained Mw was 1840, Mn was 1510, and Mw/Mn was 1.22. IR analysis of the protected oligomer shows no ν(OH) stretches in the 3300 to 3700 cm$^{-1}$ region of the spectrum and a strong ν(CO) stretch around 1770 cm$^{-1}$, indicative of complete substitution of the hydroxyl groups by a tert-butyl carbonate group.

SYNTHESIS EXAMPLE 32

Sodium hydride (2.75 g) was slurried in dry THF under nitrogen and was cooled with dry ice. To this slurry was added dropwise an oligomer solution of vinyl addition HFANB (25 g, Mw=1340, Mw/Mn=1.16) in dry, deareated THF (25 g). The mixture was allowed to stir for one hour after which chloromethylmethyl ether (9.2 g) was added in as a solution in dry, deareated THF (20 g) dropwise. The mixture was allowed to warm to room temperature overnight. The reaction mixture was washed with water, and then twice with a brine solution, then finally another water wash. The organic layer was reduced by rotovaporation and precipitated into hexane. The resulting powder (6.4 g) was collected by filtration and dried in a vacuum oven at 50° C. until a constant weight was obtained. Mw was 1300, Mn was 1110, and Mw/Mn was 1.17. IR analysis of the final product shows a marked diminution of the ν(OH) stretches in the 3300 to 3700 cm$^{-1}$ region of the spectrum consistent with substitution of the hydroxyl groups with methyl methyl ether groups.

SYNTHESIS EXAMPLE 33

The monomers Allyl HFA (17.2 g, 0.0825 mol), t-butyl ester of 5-norbornene carboxylic acid (11.4 g, 0.0825 mol), 5-cyanonorbornene (9.83 g, 0.0825 mol) and initiator, di-tert-butylperoxide (3.45 g) were added to a 3-necked flask equipped with a condenser, a nitrogen purge, and stirbar. The mixture was heated to 130° C. overnight. The sample was then cooled, and diluted with ethyl acetate. The organic phase was washed with deionized water until a neutral pH was obtained. The organic phase was separated and the solvent was removed by rotovaporation. The resulting product (33.0 g) was dried under high vacuum.

SYNTHESIS EXAMPLE 34

A 3-necked flask was fitted with a condenser, a $N_2$ purge, and a temperature probe. To this flask was added 30 g of the above product from Example 33, 80 g of toluene, 15 g of THF, 35 g of glacial acetic acid, and 35 g of 30% $H_2O_2$. The sample was heated to reflux (85° C.) for one hour and then cooled. The organic phase was washed three times with deionized water. The organic phase was separated from the aqueous phase and then poured dropwise into hexane. The precipitated oligomer was filtered and dried in a vacuum oven at 60° C. overnight.

SYNTHESIS EXAMPLE 35

A 3-necked flask fitted with condenser, temperature probe and $N_2$ relief valve was purged with dry $N_2$ for one hour. Sodium hydride (1.00 g, 0.0414 mol ) was added as a dry powder to this flask. Dry THF (50 g) was added to the flask to create a slurry. The oligomer (8.0 g) was dissolved in 20 g THF, sealed in a crimp cap vial and purged for 15 minutes. This solution was added dropwise to the slurry over a period of one hour. Chloromethyl methyl ether (3.4 g, 0.041 mol) was dissolved in 20 g of THF in a crimp capped vial and purged with $N_2$ for 15 minutes. This solution was added dropwise to the reaction mixture which was stirred overnight (16 hours) at 25° C. About 100 mL of 2 M HCl was added to the mixture and stirred. The aqueous phase was separated and the organic phase was washed with brine and followed by deionized water (twice). The organic phase was added dropwise to hexane. The precipitated oligomer was recovered by filtration and dried in a vacuum oven at 50° C. for 16 hours. Yield, 5.35 g. Mw was 2818, Mn was 1810, and Mw/Mn was 1.56.

SYNTHESIS EXAMPLE 36

The monomers, HFANB (29.7 g, 0.108 mol), Allyl HFA (22.5 g, 0.116 mol), and t-butyl ester of 5-norbornene carboxylic acid (21.0 g, 0.108 mol) were sparged with nitrogen. They were then added to a nitrogen purged 3-necked flask equipped with a condenser and stirbar. The initiator, di-tert-butyl peroxide (4.5 g, 0.031 mol), was added by syringe. The mixture was heated to 130° C. overnight. The mixture was allowed to cool. A viscous, light brown liquid resulted. The mixture was dissolved in toluene (100 mL) then added dropwise to 4 L of hexane with stirring. A light yellow powder resulted that was filtered and air dried.

The isolated oligomer (10 g) was added to a 500 mL 3-necked flask, then dissolved in 50 mL of toluene, and 10 grams of THF. Glacial acetic acid (10 g) was added to the mixture with stirring, followed by 30% hydrogen peroxide (10 g). The flask was equipped with a condensing column and heated to 80° C. for one hour. The sample was allowed to cool. In a separatory funnel, the mixture was washed with deionized water three times. The organic phase was separated and then added to hexane dropwise to precipitate the oligomer as a white powder.

SYNTHESIS EXAMPLE 37

The oligomer from Example 36 (4.75 g) was added to a dry 3-necked flask that has been purged for one hour with dry $N_2$. Sodium hydride (0.6 g, 0.025 mol) was added as a dry powder to the flask. THF was cannula-transferred to an addition funnel and added slowly with stirring to prepare a slurry of THF and sodium hydride. The oligomer solution was purged with nitrogen and added dropwise over a period of one hour to the sodium hydride slurry. Chloromethyl methyl ether (20 g, 0.025 mol) was dissolved in 10 g THF and purged with $N_2$ and added to the reaction mixture with stirring. This solution was allowed to stir overnight. After 16 hours stirring at 25° C., the reaction mixture was transferred to a separatory funnel where it was washed with 100 mL of 2M HCl twice, followed by a wash with brine and two washes with deionized water. The organic phase was separated and under high vacuum and the volatiles were removed to yield the protected oligomer. Yield, 3.86 g. Mw was 3011, Mn was 2425, and Mw/Mn was 1.24. The oligomeric product was determined to contain approximately 40 mole percent t-butyl ester of 5-norbornene carboxylic acid, 44 mole percent Allyl HFA, and 16 mole percent HFANB by $^{13}$C NMR spectrometry.

FORMULATION EXAMPLE 1

One characteristic of a good dissolution rate modifer is low volatility during bake (both post-apply and post-exposure). To test this for the peracetic acid treated oligomer of 2-(trifluoromethyl)-1,1-dimethylethyl ester of 5-norbornene-2-carboxylic acid of Synthesis Example 14, the dissolution rate of the blend of the oligomer in a suitable binder resin matrix was measured as a function of time at bake temperature. A volatile dissolution rate modifier should yield a binder resin blend with increasing dissolution rate over time. A non-volatile dissolution rate modifier should yield a constant dissolution rate over time.

The dissolution rate behavior of spun films (20 wt percent solids in PGMEA spun on 2-inch silicon wafers at 500 rpm for 15 sec followed by 2000 rpm for 60 sec then baking at 130° C. for 2 min) in 0.26 N aqueous tetramethyl ammonium hydroxide (TMAH) vs. time at a bake temperature of 130° C. for both poly(5-(2-hydroxy-2,2-bistrifluoromethyl)ethyl-2-norbornene) (Mw of 19600) and for a 5 wt percent blend with the oligomer and poly(5-(2-hydroxy-2,2-bistrifluoromethyl)ethyl-2-norbornene) (Mw of 19600) in PGMEA. The data for this experiment, shown in Table 1, clearly show that after 2 min at 130° C., there is no indication that the dissolution rate of the binder resin/oligomer blend increases after extended time at elevated temperature. Thus, in the poly(5-(2-hydroxy-2,2-bistrifluoromethyl)ethyl-2-norbornene) matrix resin, the oligomer of 5-(2-hydroxy-2,2-bistrifluoromethyl)ethyl-2-norbornene is not volatile.

| | Dissolution rate in 0.26 N aqueous TMAH | |
|---|---|---|
| Bake time (min) | Oligomer dissolution rate modifier loading of 0% | Oligomer dissolution rate modifier loading of 5% |
| 2 | 98 | 15 |
| 3 | 104 | 16 |
| 4 | — | 17 |
| 5 | 119 | 17 |
| 6 | 100 | 17 |
| 7 | 98 | 16 |
| 8 | 98 | 17 |

FORMULATION EXAMPLE 2

This example demonstrates the dissolution inhibition of HFANB homopolymer by DR modifiers from 12, 13, and 16. Dissolution rate modifiers from Synthesis Examples 12, 13, and 16 were blended with a base resin, homopolymer of 5-(2-hydroxy-2,2-bistrifluoromethyl)ethyl-2-norbornene (Mw=12900 Mn=6640), at increasing concentrations along with triphenylsulfonium nonaflate Solutions of base resin were prepared in PGMEA along with the dissolution rate modifier at increasing concentration (0, 5, 10, 15, and 20% by weight on the base resin used). The concentration of the base resin was modified to keep the total weight of the solids at approximately 20%. Triphenylsulfonium nonaflate was added at 3% wt/wt solution.

Substrates were prepared on hexamethyldisilazane (HMDS) primed silicon wafers (soft baked at 130° C. for 90 seconds). The solutions prepared above were spun using a spin program of 500 rpm for 30 seconds followed by 2000 rpm for 60 seconds, followed by a soft bake at 130° C. for 20 seconds.

| | Dissolution rate (nm/sec) | | |
|---|---|---|---|
| Wt % dissolution rate modifier | Synthesis Example 12 | Synthesis Example 13 | Synthesis Example 16 |
| 0 | 13 | 13 | 13 |
| 5 | 3 | 2 | 11 |
| 10 | 0.3 | 0* | 0.3 |
| 15 | 0* | 0* | 0* |
| 20 | 0* | 0* | 0* |

*Developer was left on the film for 15 minutes with no sign of dissolution.

FORMULATION EXAMPLE 3

This example provides Meyerhofer Plots of HFANB homopolymer blended with the DR modifier from Synthesis Example 14. The dissolution rate modifier from Synthesis Example 14 was blended with a base resin, homopolymer of 5-(2-hydroxy-2,2-bistrifluoromethyl)ethyl-2-norbornene (Mw=12900 Mn=6640), at increasing concentrations along with triphenylsulfonium nonaflate.

Solutions of base resin were prepared in PGMEA along with the dissolution rate modifier at increasing concentration (0, 5, 10, 15, and 20% by weight on the base resin used). The concentration of the base resin was modified to keep the total weight of the solids at approximately 20%. Triphenylsulfonium nonaflate was added at 3% wt/wt solution.

Substrates were prepared on hexamethyldisilazane (HMDS) primed silicon wafers (soft baked at 130° C. for 90 seconds). The solutions prepared above were spun using a spin program of 500 rpm for 30 seconds followed by 2000 rpm for 60 seconds, followed by a soft bake at 130° C. for 120 seconds.

The unexposed wafers were developed in 0.26 N TMAH. Films that demonstrated no immediate discernable dissolution were monitored 15 minutes or until the film lifted from the substrate.

Identical wafers were also blanket exposed at 515 mJ/cm$^2$ using a 248 nm light. A post-exposure bake of 130° C. for 120 seconds was applied. The dissolution of these films were determined in 0.26 N TMAH.

The results of the dissolution rates of the exposed and unexposed films as a function of added dissolution rate modifier is shown in FIG. 1, which is a Meyerhofer plot of dissolution rate modifier from Synthesis Example 14 blended with homopolymer of 5-(2-hydroxy-2,2-bistrifluoromethyl)ethyl-2-norbornene.

FORMULATION EXAMPLE 4

This example demonstrates the etch resistance of the present formulations. The dissolution rate modifiers from Examples 12, 13, 14, and 16 were blended with a homopolymer of 5-(2-hydroxy-2,2-bistrifluoromethyl)ethyl-2-norbornene (Mw=12900 Mn=6640), at 20 wt percent along with triphenylsulfonium nonaflate at 1 wt percent. Blanket reactive ion etch was performed on novolac, the binder resin alone (a homopolymer of 5-(2-hydroxy-2,2-bistrifluoromethyl) ethyl-2-norbornene) and the binder resin formulated with the peroxyacetic acid treated dissolution rate modifier from Synthesis Example 14. Samples were prepared as 20% solids solutions in PGMEA. The formulated sample was prepared with a 20% wt/wt load of the modifier. Silicon wafers were primed with hexamethyldisilazine (HMDS) and baked for 130° C. for 60 seconds. Polymer solutions were then filtered through a 0.2 μm TEFLON® syringe type filter and spun for 500 rpm for 30 seconds and then 2000 rpm for 60 seconds. Finally, they were soft baked at 130° C. for 120 seconds.

Etching was performed on a Plasma Therm Reactive Ion Etcher (RIE). Samples were etched for 60 seconds, removed and thickness measurements taken on a J. A. Woollam model M-2000 ellipsometer. Etch conditions were as follows: $CHF_3$/$O_2$ plasma, chamber pressure of 50 mTorr, supplied power of 150 W, etch time of 60 seconds, and flow rates for both gas streams was 25 sccm.

The etch rate for novolac was determined to be 323.2 nm/s and then normalized to 1.0. Relative to novolac, the binder resin had an etch rate of 1.50, and the sample formulated with the modifier had a relative etch rate 1.68. Only a small increase in etch rate is observed upon formulation with the dissolution rate modifier.

FORMULATION EXAMPLE 5

The unprotected oligomer from Synthesis Example 23 was blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies with 0.26 N aqueous TMAH.

The oligomer from Synthesis Example 27, in which all hydroxyl groups are protected with acid labile moieties (methoxymethyl ether or MOM-protected), was blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

The oligomer from Synthesis Example 25, in which all hydroxyl groups are protected with acid labile moieties (t-butyl carbonate or tBOC-protected), was blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

Figure 10:
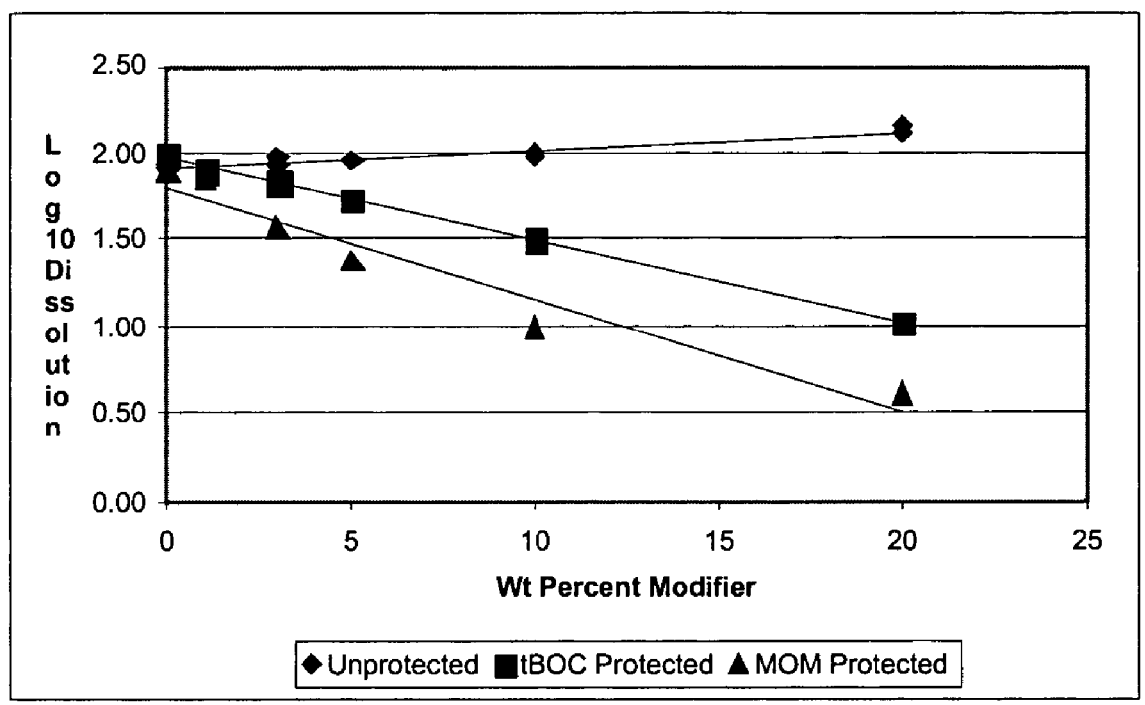
FIG. 10 shows a "simulated" Meyerhofer plot of dissolution rate versus dissolution rate modifier concentration.

The results from these studies enable the construction of a "simulated" Meyerhofer plot in that no exposure of the films was done. Nevertheless, the data generated using protected oligomers from Synthesis Examples 25 and 27 show that they suppress the dissolution rate of the base resin and therefore mimic the unexposed region of the wafer, and that films generated using the unprotected oligomer from Synthesis Example 24 do not suppress the dissolution rate of the base resin and therefore mimic the exposed region of the wafer. The "simulated" Meyerhofer plot is shown in FIG. 10.

FORMULATION EXAMPLE 6

The oligomer from Synthesis Example 29, in which all acidic groups are protected with acid labile moieties (methoxymethyl ether, or MOM-protected), was blended with a homopolymer of HFANB (Mw=6920) at 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

The oligomer from Synthesis Example 30, in which all acidic groups remain unprotected, was blended with a homopolymer of HFANB (Mw=6920) at 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

Figure 11:
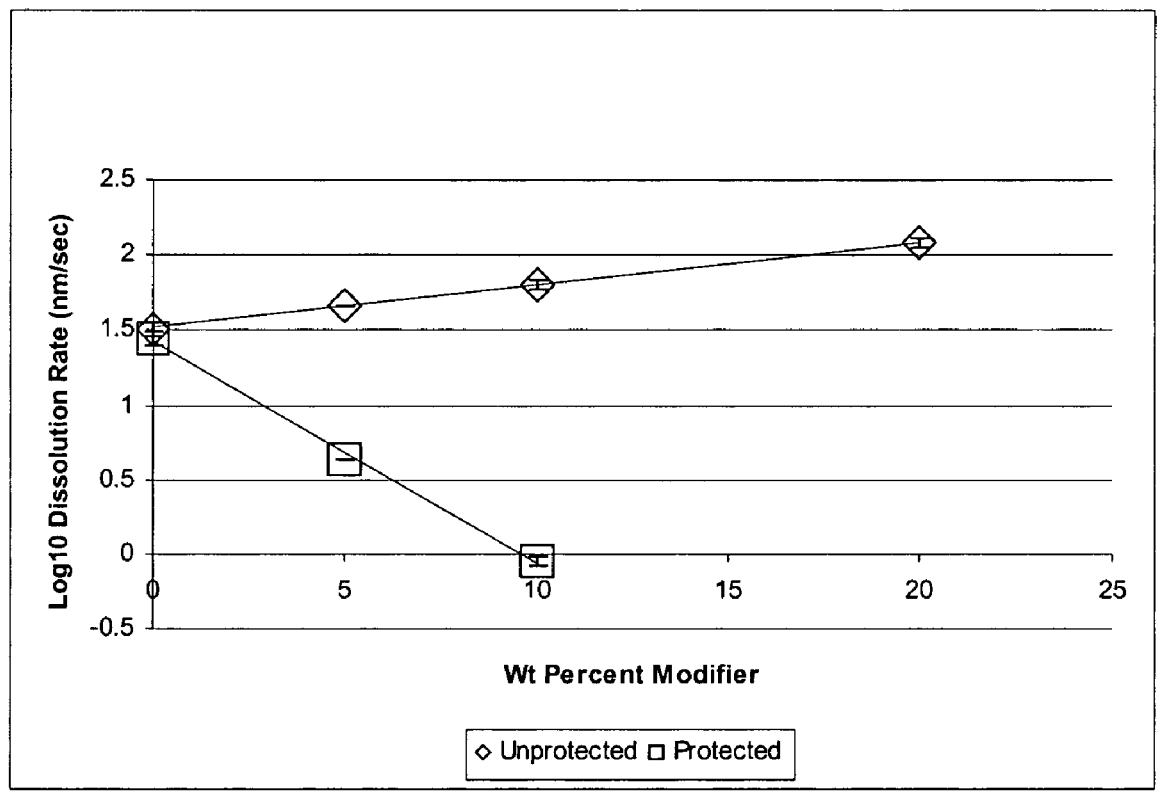
FIG. 11 shows a "simulated" Meyerhofer plot of dissolution rate versus dissolution rate modifier concentration.

The results from these two studies enable the construction of a "simulated" Meyerhofer plot in that no exposure of the films was carried out. Nevertheless, the data generated using protected oligomer from Synthesis Example 29 show that it suppresses the dissolution rate of the base resin and therefore mimics the unexposed region of the wafer, and that films generated using the unprotected oligomer from Synthesis Example 30 enhance the dissolution rate of the base resin and, therefore, mimic the exposed region of the wafer. The "simulated" Meyerhofer plot is shown in FIG. 11.

FORMULATION EXAMPLE 7

Oligomers of HFANB (Mw=1670, Mw/Mn=1.19) were blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies with 0.26 N aqueous TMAH.

The oligomer from Synthesis Example 31, in which all the hydroxyl groups have been protected with an acid labile tert-butyl carbonate group (tBOC-protected), was blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

The oligomer from Synthesis Example 32, in which all the hydroxyl groups have been protected with an acid labile methoxymethyl ether group (MOM-protected), was blended with a homopolymer of HFANB (Mw=5600) at 3, 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

Figure 12:
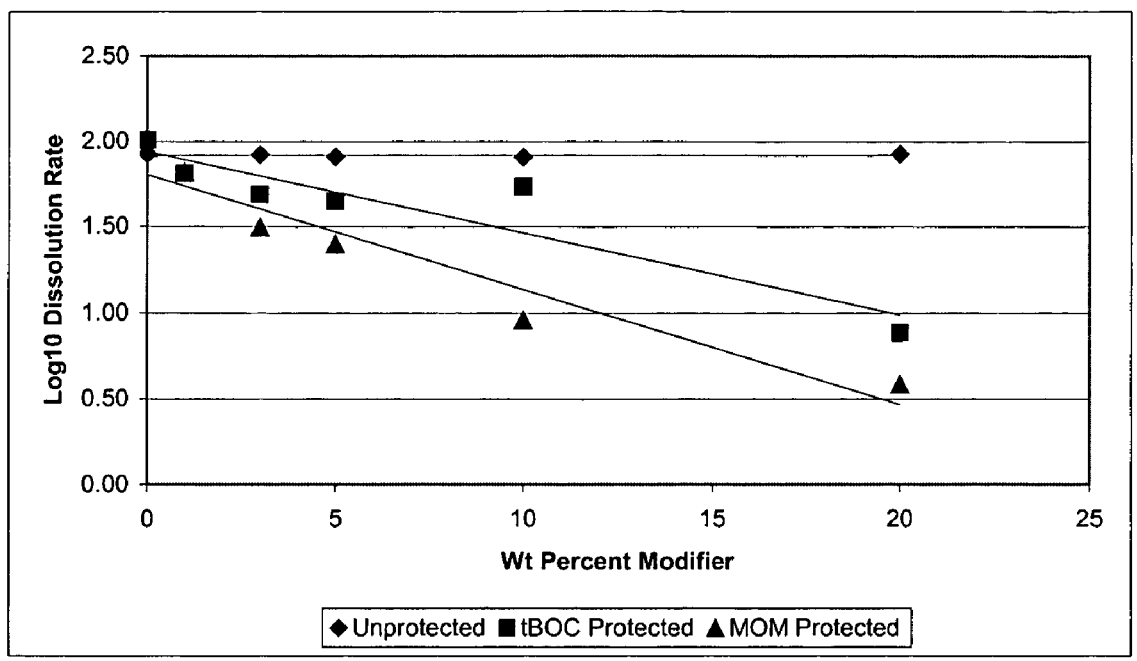
FIG. 12 shows a "simulated" Meyerhofer plot of dissolution rate versus dissolution rate modifier concentration.

The results from these studies enable the construction of a "simulated" Meyerhofer plot in that no exposure of the films were done. Nevertheless, the data generated using protected oligomers from Synthesis Examples 30 and 31 show that they suppress the dissolution rate of the base resin and therefore mimic the unexposed region of the wafer, and that films generated using the unprotected vinyl addition HFANB oligomer do not suppress the dissolution rate of the base resin and, therefore, mimic the exposed region of the wafer. The "simulated" Meyerhofer plot is shown in FIG. 12.

FORMULATION EXAMPLE 8

Oligomers of Allyl HFA, t-butyl ester of 5-norbornene carboxylic acid, and 5-cyanonorbornene (Mw=2240, Mw/Mn=1.64) (Synthesis Example 33) were blended with a homopolymer of HFANB (Mw=3990, Mw/Mn=1.60) at 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies with 0.26 N aqueous TMAH.

The oligomer from Synthesis Example 34, in which all the hydroxyl groups have been protected with a methoxymethyl ether group (MOM-protected), was blended with a homopolymer of HFANB (Mw=3990, Mw/Mn=1.60) at 5, 10 and 20 weight percent in PGMEA. These formulations were then spin-coated on HMDS primed silicon wafers and soft baked at 130° C. for 2 min to remove solvent. The resulting films (approximately 1 micron thick) were then subjected to dissolution rate studies in 0.26 N aqueous TMAH.

Figure 13:
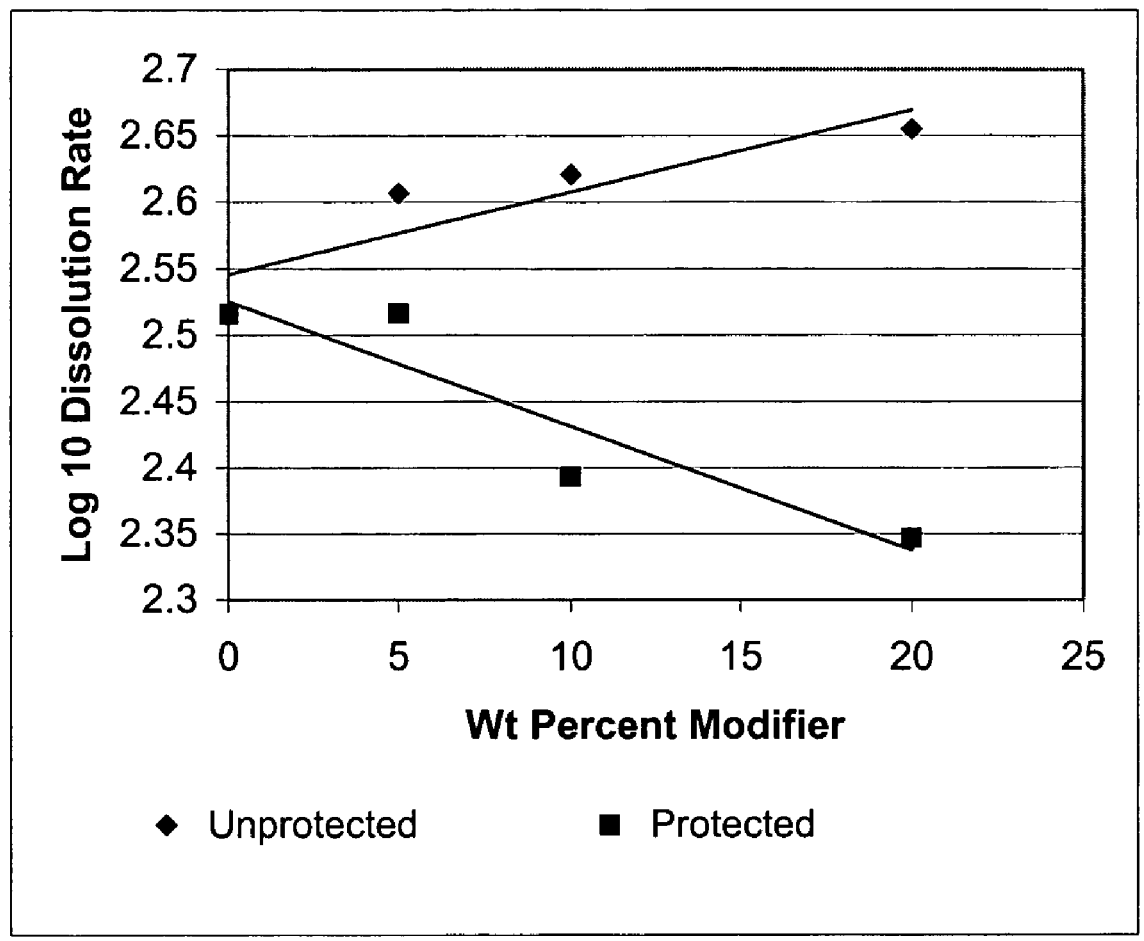
FIG. 13 shows a "simulated" Meyerhofer plot of dissolution rate versus dissolution rate modifier concentration.
Figure 14:
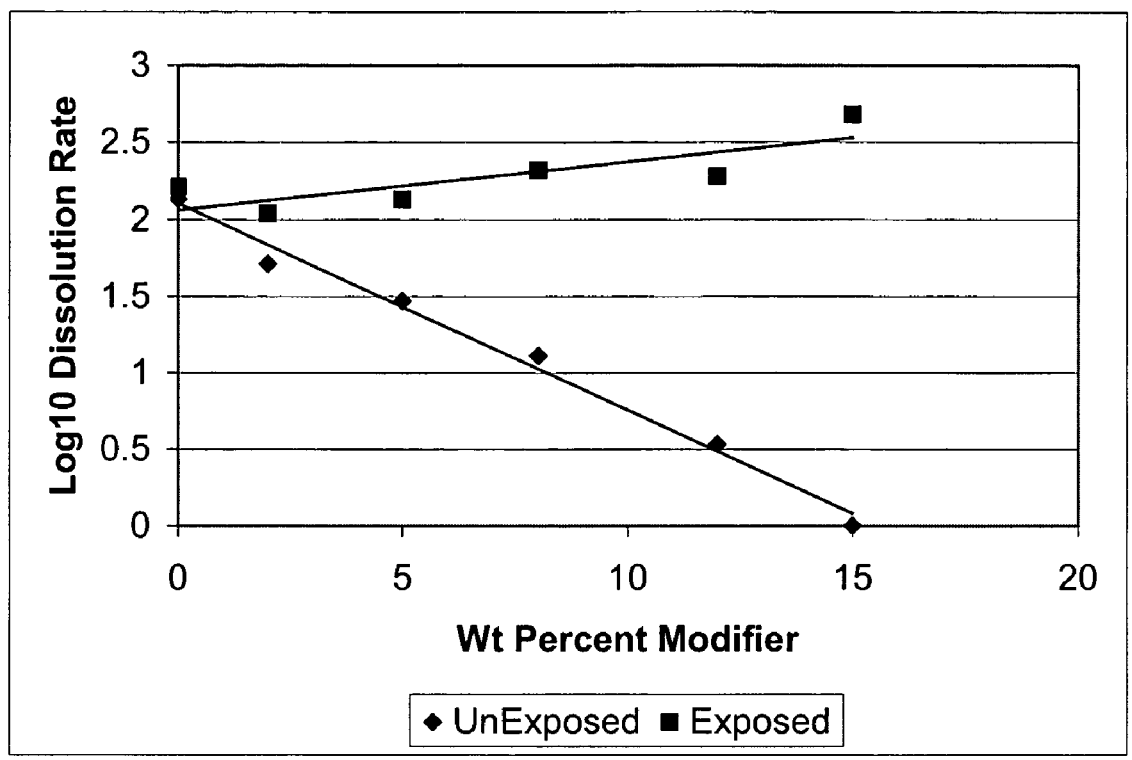
FIG. 14 shows a "simulated" Meyerhofer plot of dissolution rate versus dissolution rate modifier concentration.

The results from these studies enable the construction of a "simulated" Meyerhofer plot in that no exposure of the films were done. Nevertheless, the data generated using protected oligomers from Synthesis Examples 33 and 34 show that they suppress the dissolution rate of the base resin and, therefore, mimic the unexposed region of the wafer, and that films generated using the unprotected vinyl addition teroligomer (Synthesis Example 33) do not suppress the dissolution rate of the base resin and, therefore, mimic the exposed region of the wafer. The "simulated" Meyerhofer plot is shown in FIG. 13.

FORMULATION EXAMPLE 9

Samples were prepared by dissolving the base polymer (100% vinyl addition HFANB homopolymer) in propylene glycol methyl ether acetate (PGMEA) at 20% solids. These solutions were filtered twice through a 0.2 mm TEFLON® syringe type filter and applied dropwise to a silicon wafer. The wafers were spun at a protocol of 500 rpm for 20 seconds, followed by 2000 rpm for 60 seconds. The wafers were soft baked at 130° C. for 90 seconds to remove the solvent. The optical density was measured by ellipsometry. Measurements are reported as index of refraction (n) and extinction coefficients (k). From this work, the absorption coefficient ($\alpha$) can be derived as $\alpha=4\pi k/\lambda$ where $\lambda$ is the wavelength of interest (157 or 193 nm). The transmittance (T) is derived from $T=e^{-\alpha t}$, and absorbance (A) defined as $A=-\log T$. Dividing this absorbance number by the film thickness in microns gives the optical density (OD).

| Example No. | Binder Resin | DR modifier additive | OD @ 193 nm | OD @ 157 nm |
|---|---|---|---|---|
| 9a | HFANB homopolymer (Mw = 5600) | none | 0.08 | 1.60 |
| 9b | HFANB homopolymer (Mw = 5600) | Example 32 (25 wt %) | 0.14 | 1.43 |
| 9c | HFANB homopolymer (Mw = 5600) | Example 31 (25 wt %) | 0.14 | 1.39 |
| 9d | HFANB homopolymer (Mw = 5600) | Example 27 (25 wt %) | 0.14 | 1.49 |
| 9e | HFANB homopolymer (Mw = 5600) | Example 25 (25 wt %) | 0.14 | 1.63 |

The data show that addition of dissolution rate modifiers of the present invention to the binder resin (HFANB homopolymer), Examples C2 and C5, only increase the optical density (OD) at 193 nm slightly and do not increase the OD at 157 nm and may, in some cases, actually decrease it somewhat compared to the neat binder resin (comparative example C1).

FORMULATION EXAMPLE 10

Examples 10a-10i were samples prepared on HMDS primed silicon wafers. Polymer solutions (20% solids in PGMEA) containing 20 weight percent of oligomer dissolution rate modifier were spin coated on silicon wafers using the following protocol: 500 rpm for 20 seconds, followed by 2000 rpm for 60 seconds. The wafers were soft-baked at 130° C. for 120 seconds. The wafers were cooled to room temperature and placed into the etch chamber (Plasma Therm). The wafers were then etched under the following conditions: $CHF_3/O_2$ in a 9:1 ratio, $CHF_3$ flow rate=22.5 sccm, $O_2$ flow rate=2.25 sccm, P=100 mTorr, Chuck power=200W. The resulting etch data, relative to Novolac, are given in the following table.

| Example No. | Binder Resin | DR modifier additive (wt percent) | Etch (Å/min) | Relative etch rate |
|---|---|---|---|---|
| 10a | Novolac | none | 648.9 | 1.00 |
| 10b | HFANB homopolymer (Mw = 5600) | none | 1030.4 | 1.59 |
| 10c | HFANB homopolymer (Mw = 5600) | none | 960.3 | 1.48 |
| 10d | HFANB homopolymer (Mw = 5600) | Example 24 (20 wt %) | 1003.5 | 1.55 |
| 10e | HFANB homopolymer (Mw = 5600) | Example 25 (20 wt %) | 1060.2 | 1.63 |
| 10f | HFANB homopolymer (Mw = 5600) | Example 27 (20 wt %) | 974.3 | 1.50 |
| 10g | HFANB homopolymer (Mw = 5600) | $\alpha,\alpha$-bis(trifluoromethyl)bicyclo[2.2.1]hept-5-ene-2-ethanol homooligomer (Mw = 1670) (20 wt %) | 947.7 | 1.46 |
| 10h | HFANB homopolymer (Mw = 5600) | Example 31 (20 wt %) | 1004.7 | 1.55 |
| 10i | HFANB homopolymer (Mw = 5600) | Example 32 (20 wt %) | 953.0 | 1.47 |

The data show that compared to the neat binder resin (HFANB homopolymer), Examples D2 and D3, the addition of the oliogomeric dissolution rate modifiers (20 weight percent) of the present invention does not markedly change the etch rate of the resulting film. Etch rates are reported relative to Novolac.

FORMULATION EXAMPLE 11

Homopolymer of HFANB (Mw=5600) was dissolved in PGMEA and spin coated on an HMDS primed silicon wafer and soft baked at 130° C. for 2 min to remove solvents. The resulting film (approximately 1 micron thick) was cross-hatched and placed on a hot stage. The cross-hatch was observed while the wafer was heated. The point at which the polymer in the cross-hatched area began to flow was considered to be the flow temperature. Flow temperature=215° C.

FORMULATION EXAMPLE 12

The unprotected oligomer from Synthesis Example 24 was blended with a homopolymer of HFANB (Mw=5600) at 20 weight percent in PGMEA. This formulation was then spin-coated on an HMDS primed silicon wafers and soft baked at 130° C. for 2 min to remove solvent. The resulting film (approximately 1 micron thick) was cross-hatched and placed on a hot stage. The cross-hatch was observed while the wafer was heated. The point at which the polymer in the cross-hatched area began to flow was considered to be the flow temperature. Flow temperature=180° C.

FORMULATION EXAMPLE 13

Oligomers of HFANB (Mw=1670, Mw/Mn=1.19) were blended with a homopolymer of HFANB (Mw=5600) at 20 weight percent in PGMEA. This formulation was then spin-coated on an HMDS primed silicon wafers and soft baked at 130° C. for 2 min to remove solvent. The resulting film (approximately 1 micron thick) was cross-hatched and placed on a hot stage. The cross-hatch was observed while the wafer was heated. The point at which the polymer in the cross-hatched area began to flow was considered to be the flow temperature. Flow temperature=185° C.

FORMULATION EXAMPLE 14 (COMPARATIVE)

Commercial poly(parahydroxystyrene) (Mw ca. 9,000; Tg ca. 164° C. by differential scanning calorimetry) was dissolved in PGMEA. This formulation was then spin-coated on an HMDS primed silicon wafers and soft baked at 130° C. for 2 min to remove solvent. The resulting film (approximately 1 micron thick) was cross-hatched and placed on a hot stage. The cross-hatch was observed while the wafer was heated. The point at which the polymer in the cross-hatched area began to flow was considered to be the flow temperature. Flow temperature=180° C.

Formulation Examples 11-14 show that the oligomeric dissolution rate modifiers of the present invention depress the flow temperature of cyclic olefin polymers. The comparative example shows that flow temperature is, in all likelihood, a few degrees higher than the glass transition temperature. These results support the notion that the flow temperature is somewhat higher than the glass transition temperature of the polymeric film and that addition of low molecular weight dissolution rate modifiers suppress the glass transition temperature.

IMAGING EXAMPLE 1

This example demonstrates optical imaging using the dissolution rate modifier of Synthesis Example 11. Stock solutions were prepared in the following manner. The base resin, a homopolymer of 5-(2-hydroxy-2,2-bistrifluoromethyl)ethyl-2-norbornene (Mw 12850, Mn 6640) was prepared as a solution of 0.5 g base resin/1.0 g PGMEA, the dissolution rate modifier a cooligomer of t-butylester of 5-norbornene-2-carboxylic acid, and 5-(2-hydroxy-2,2-bistrifluoromethyl)ethyl-2-norbornene from Synthesis Example 11 as 0.115 g modifier/1.0 g PGMEA, and the photo acid generator, or PAG (triphenylsulfonium perfluoro-1-butanesulfonate) as 0.05 g PAG/1.0 g PGMEA. These components were then combined with enough additional PGMEA to form a final solution consisting of 20% modifier, and 1% photo acid generator.

Silicon wafers <1,0,0> were pretreated by spinning hexamethyl disilazane (HMDS) onto the wafer at 500 rpm for 10 seconds followed by 2000 rpm for 60 seconds. The wafers were then dried by a soft bake at 130° C. for 90 seconds. Resin/modifier/PAG samples were cast onto the wafers by applying approximately 2 mL to the center of the wafer, and spinning at 500 rpm for 10 seconds, followed by 2000 rpm for 60 seconds. These samples were soft-baked at 130° C. for 120 seconds and allowed to cool.

Images were obtained by illuminating the sample on an Oriel 87000 series Hg—Xe flood exposure tool with a DUV bandpass filter with a center wavelength of 248 nm and a full width half max (FWHM) of 10 nm. Samples were then exposed at an intensity of 500 mJ/cm$^2$ through a chrome on quartz mask (LSI photomask). A post exposure bake of 130° C. for 120 seconds was applied, at which point a latent image appeared. The sample was then immersed in a solution of tetramethylammonium hydroxide (0.26 N) for 60 seconds, followed by rinse in deionized water and drying in a stream of nitrogen.

Figure 3A:
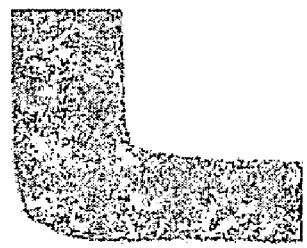
FIGS. 3A, 3B, and 3C show electron micrographs of images made according to the present invention.
Figure 3B:
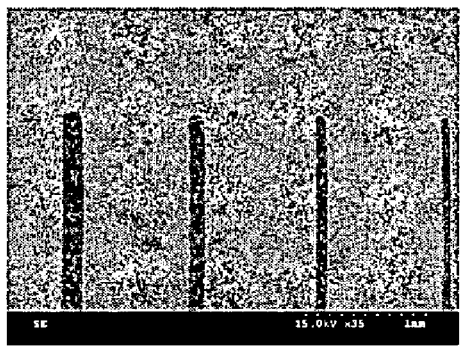
Figure 3C:
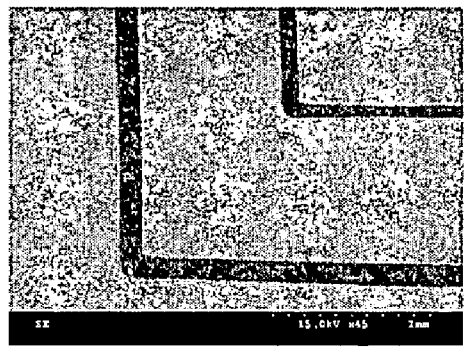

SEM micrographs were obtained on a Hitachi 3500H Scanning Electron Microscope (SEM) (see FIGS. 3A, 3B and 3C), which show approximately 80 micron line widths. The SEM shows an image obtained from a film containing 20 wt. % of the dissolution rate inhibitor from Example 11 in a homopolymer of 5-(2-hydroxy-2,2-bistrifluoromethyl)ethyl-2-norbornene.

IMAGING EXAMPLE 2

Figure 4A:
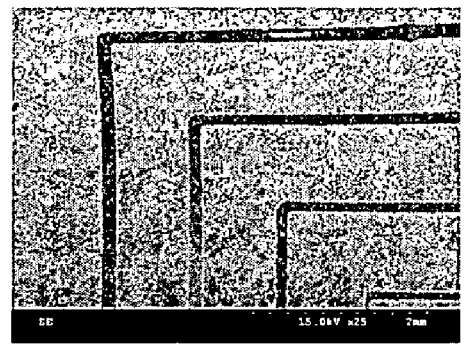
FIGS. 4A, 4B, and 4C show electron micrographs of images made according to the present invention.
Figure 4B:
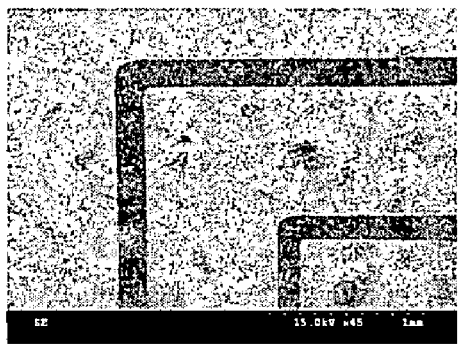
Figure 4C:
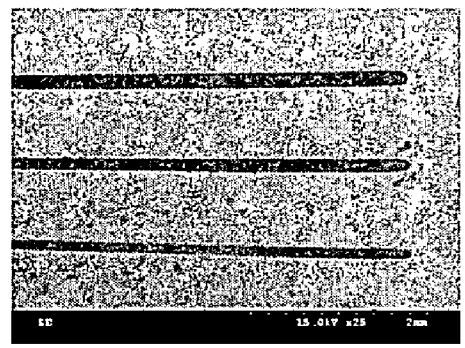

This example demonstrates imaging using the dissolution rate modifier of Synthesis Example 16. This example was a repeat of Imaging Example 1 except that the dissolution rate modifier from Synthesis Example 16 was used. FIGS. 4A, 4B, and 4C shows approximately 200 micron line widths.

The SEM shows images obtained from a film containing 20 wt percent of the dissolution rate inhibitor from Example 16 in homopolymer of 5-(2-hydroxy-2,2-bistrifluoromethyl)ethyl-2-norbornene.

IMAGING EXAMPLE 3

This example demonstrates imaging using the dissolution rate modifier of Synthesis Example 12. This example was a repeat of Imaging Example 1 except that the dissolution rate modifier from Synthesis Example 12 was used.

Figure 5A:
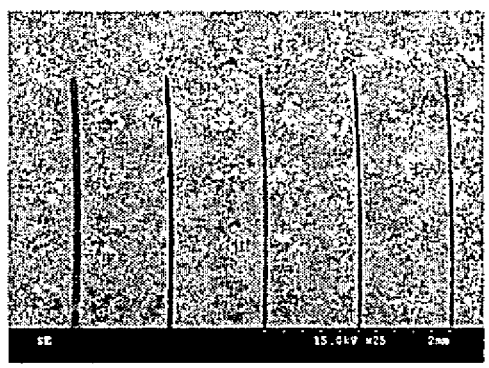
FIGS. 5A, 5B, and 5C show electron micrographs of images made according to the present invention.
Figure 5B:
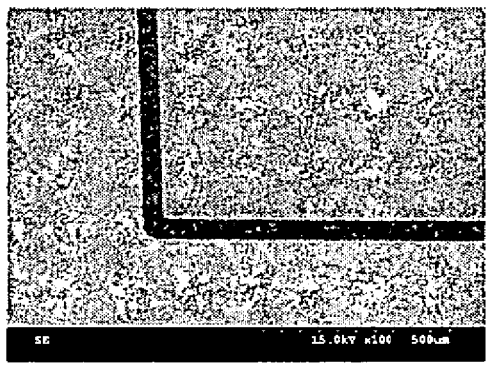
Figure 5C:
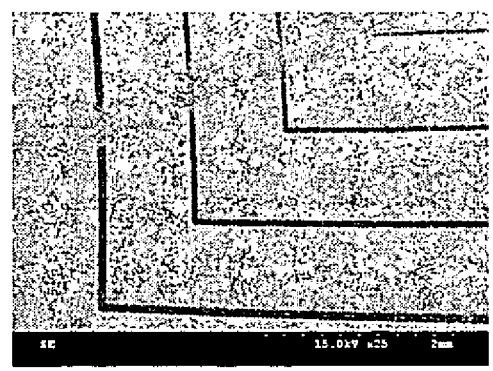

FIGS. 5A, 5B, and 5C show approximately 75 micron line width SEM of the images obtained from a film containing 20 wt percent of the dissolution rate inhibitor from Example 12 in a homopolymer of 5-(2-hydroxy-2,2-bistrifluoromethyl)ethyl-2-norbornene.

IMAGING EXAMPLE 4

This example demonstrates imaging using the dissolution rate modifier of Synthesis Example 13. This example was a repeat of Imaging Example 1 except that the dissolution rate modifier from Synthesis Example 13 was used.

Figure 6A:
FIGS. 6A, 6B, and 6C show electron micrographs of images made according to the present invention.
Figure 6B:
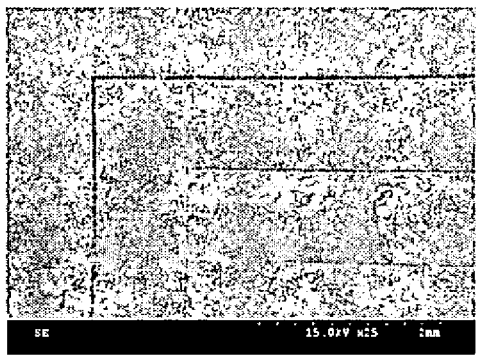
Figure 6C:
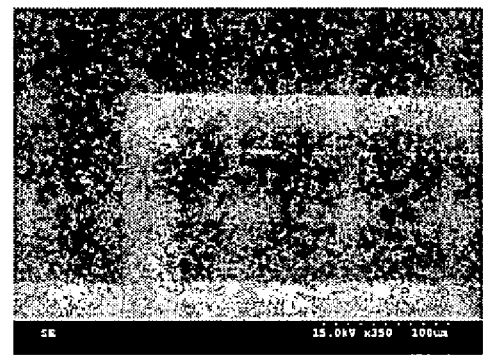

FIGS. 6A, 6B, and 6C show approximately 50 micron line width SEM of images obtained from a film containing 20 wt. % of the dissolution rate inhibitor from Example 13 in homopolymer of 5-(2-hydroxy-2,2-bistrifluoromethyl)ethyl-2-norbornene.

IMAGING EXAMPLE 5

This example demonstrates imaging using the dissolution rate modifier of Synthesis Example 14. This example was a repeat of Imaging Example 1 except that the dissolution rate modifier from Synthesis Example 14 was used.

Figures 7A, 7B, 7C:
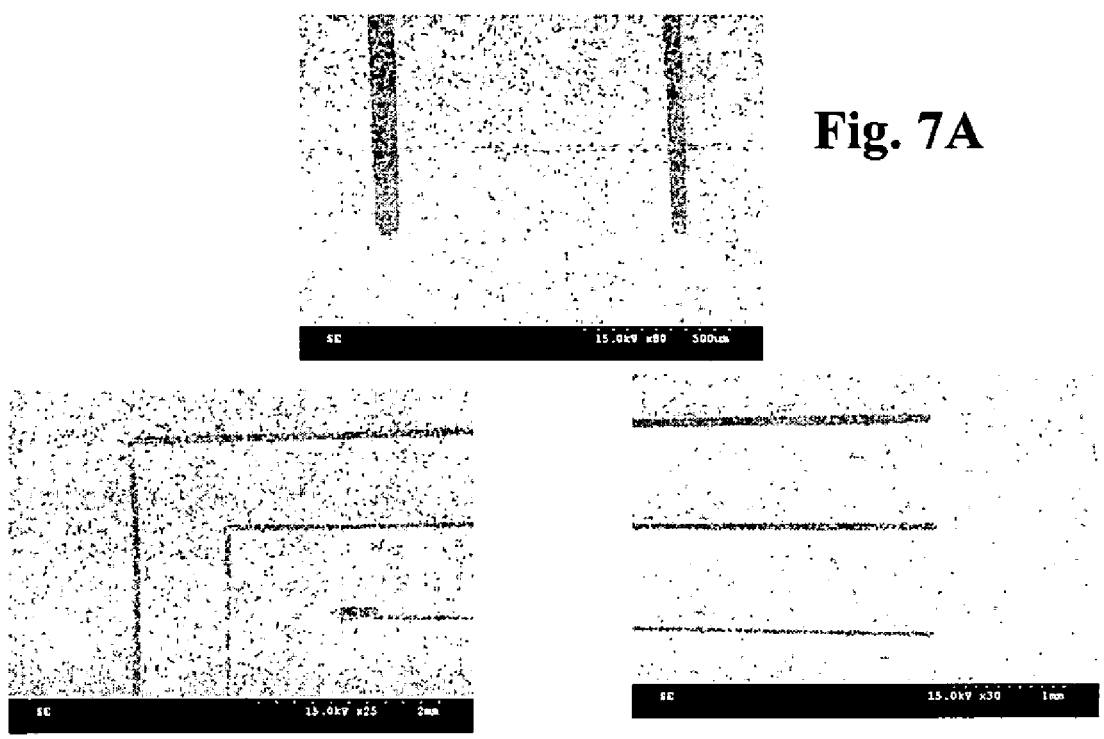
FIGS. 7A, 7B, and 7C show electron micrographs of images made according to the present invention.

FIGS. 7A, 7B, and 7C show approximately 50 micron line width SEM of images obtained from a film containing 20 wt. % of the dissolution rate inhibitor from Example 14 in homopolymer of 5-(2-hydroxy-2,2-bistrifluoromethyl)ethyl-2-norbornene.

IMAGING EXAMPLE 6

This is an imaging example using the dissolution rate modifier of Example 11. Samples and wafers were prepared and formulated as in Imaging Example 1.

Electron Beam Exposures were performed at 25 keV accelerating potential at 10 picoamp writing current. Immediately after exposure, the samples were vented from the chamber and transferred to a hot plate. The post-exposure bake was at 130° C. for 2 minutes. Samples were developed in 0.26 N tetramethylammonium hydroxide.

Figure 8A:
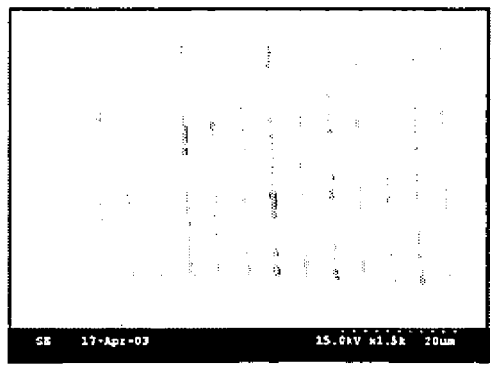
FIGS. 8A, 8B, and 8C show electron micrographs of images made according to the present invention.
Figure 8B:
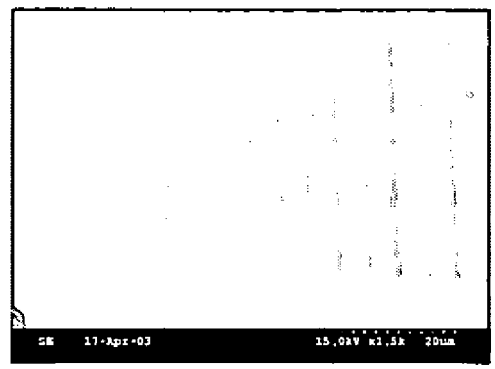
Figure 8C:
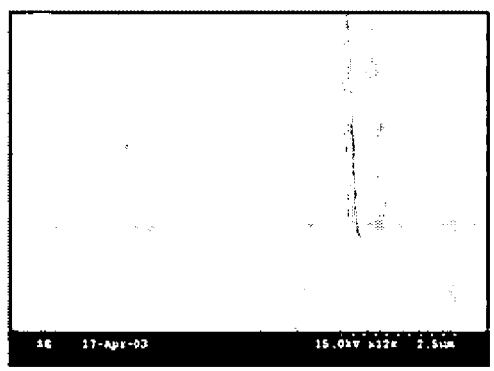

FIGS. 8A (10 μC/cm² steps), 8B (5 μC/CM² steps), and 8C (20 and 30 μC/cm² steps) show that approximately 2 micron line widths resulted.

IMAGING EXAMPLE 7

This is an imaging example using the dissolution rate modifier of Example 14. Samples and wafers were prepared and formulated as in Imaging Example 5.

Electron Beam Exposures were performed at 25 keV accelerating potential at 10 picoamp writing current. Immediately after exposure, the samples were vented from the chamber and transferred to a hot plate. The post exposure bake was at 130° C. for 2 minutes. Samples were developed in 0.26 N tetramethylammonium hydroxide.

Figure 9A:
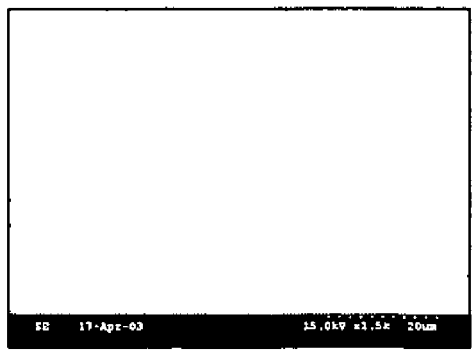
FIGS. 9A and 9B show electron micrographs of images made according to the present invention.
Figure 9B:
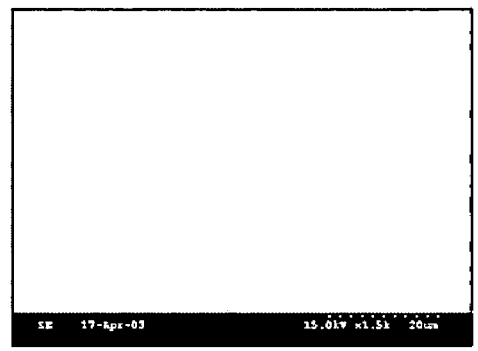

FIGS. 9A (10 μC/cm² steps) and 9B (50 μC/cm² steps) show the resulting images.

IMAGING EXAMPLE 8

An HMDS primed silicon wafer was spin coated, according to the procedure in Example F1, with a PGMEA solution of homopolymer of vinyl addition HFANB (Mw=4000, Mw/Mn=1.60) formulated with 15 wt percent of dissolution rate inhibitor (methoxymethyl ether protected ter-oligomer of HFANB, Allyl HFA, and t-butyl ester of 5-norbornene carboxylic acid from Synthesis Example 36 and 2 wt percent triphenylsulfonium perfluorobutanesulfonate (nonaflate) on the total polymer. This film was exposed with UV radiation (248 nm, 100 mJ/cm2) through a quartz mask, followed by a 90 sec post-exposure bake at 130° C. The wafer was then developed for 90 sec with 0.26 N aqueous TMAH solution. High resolution positive tone images were obtained.

OPTICAL DENSITY EXAMPLE 1

This example evaluates the optical density a HFANB homopolymer base resin with 10% of the dissolution rate modifier of Example 14. A 20 weight percent solution of the base polymer, a homopolymer of 5-(2-hydroxy-2,2-bistrifluoromethyl)ethyl-2-norbornene (Mw 8870, Mn 4880) in propylene glycol methylether acetate (PGMEA) is dispensed onto a 1 inch quartz wafer through a 0.2 micron TEFLON® syringe filter and spun at 500 rpm for 10 sec and 2000 rpm for 60 sec. The wafers are then baked for 60 sec at 130° C.

A second solution was prepared in a like manner, except 10% by weight, on the base polymer, of the dissolution rate modifier from Example 14 was added to the mixture. A thin film of this solution was prepared in a similar manner as above.

The optical absorbance was measured at 193 nm using a Cary 400 Scan UV-Vis spectrophotometer. The thickness of the films were measured using a TENCOR Profilometer after the films are scored. The optical density of the film was then calculated by dividing the absorbance by the thickness (in microns).

The optical density of the first film, i.e., without dissolution rate modifier added was 0.028 absorbance units/micron. The optical density of the second film, i.e., with 10 weight percent dissolution rate modifier from Example 14 added, was 0.049 absorbance units/micron.

OPTICAL DENSITY EXAMPLE 2

A homopolymer of vinyl addition HFANB (Mw=4000, Mw/Mn=1.60) was formulated with 0, 2, 5, 8, 12, and 15 wt percent of dissolution rate inhibitor (methoxymethyl ether protected ter-oligomer of HFANB, Allyl HFA, and t-butyl ester of 5-norbornene carboxylic acid from Synthesis Example 36 and 2 wt percent triphenylsulfonium perfluorobutanesulfonate (nonaflate) on the total polymer used. The solutions were passed through a 0.2 μm TEFLON® filter twice before deposition on a HMDS primed wafer. The wafers were spun at 500 rpm for 10 sec followed by 2000 rpm for 60 sec. The wafers were then soft-baked at 130° C. for 90 sec. A portion of the wafer was exposed to UV radiation (248 nm, 515 mJ/cm² followed by a 90 sec post-exposure bake at 130° C. The dissolution rates (nm/sec) of the exposed and unexposed portions of the films in 0.26 N aqueous TMAH solution were measured using optical interferometry. The results of this study expressed in log dissolution rate, known as a Meyerhofer plot, are presented in FIG. 5.

These results clearly show that oligomers of the present invention protected with acid labile groups truly suppress the dissolution rate of the base polymer in unexposed areas and accelerate the dissolution rate of the base polymer in the exposed areas.

The present invention has been described with reference to specific details of particular embodiments thereof. It is not intended that such details be regarded as limitations upon the scope of the invention except insofar as and to the extent that they are included in the accompanying claims.

We claim:

1. an oligomer comprising repeating units derived from monomers in accordance with one or more of Formulae A, B, C, D or E:

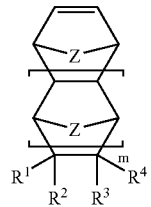

Formula A

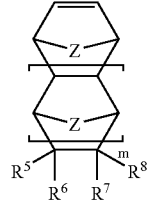

Formula B

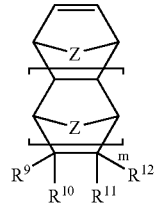

Formula C

Formula D

-continued

Formula E

said repeating units comprising a first repeating unit derived monomers comprising a fluorinated acid labile group substituent according to Formula A and/or Formula E, and optionally other repeating units comprising one or more of the monomers according to Formulae A, B, C, D or E, with the proviso that if a monomer according to Formula A is not present, a monomer according to Formula E must be included and if a monomer according to Formulae D or E are present at least one monomer according to Formulae A, B or C must be present, with the proviso that where at least one repeating unit is derived from Formulae D or E, deriving the oligomer comprises employing a free radical catalyst and where said repeating units are only derived from monomers according to Formulae A, B and/or C, deriving the oligomer comprises employing a Ni or Pd comprising catalyst;

wherein m is an integer from 0 to 5; Z is $-CH_2-$, $-CH_2-CH_2-$, $-O-$, $-S-$, or $-NH-$; wherein at least one substituent $R^1$, $R^2$, $R^3$, $R^4$, independently, is a fluorinated carbinol having from 1 to about 10 carbon atoms optionally protected by an acid labile group, and the remaining $R^1$, $R^2$, $R^3$, and $R^4$, independently, are hydrogen, halogen, or a hydrocarbyl containing from 1 to about 20 carbon atoms, or a hydrocarbyl having from 1 to about 20 carbon atoms substituted at any hydrogen atom with an O, S, N, or Si, or a fluorinated hydrocarbyl having from 1 to about 20 carbon atoms wherein each carbon atom, independently, is substituted with 0, 1, 2, or 3 fluorine atoms; wherein at least one of $R^5$, $R^6$, $R^7$, or $R^8$ independently contain an acid labile moiety, and the remaining one or more $R^5$, $R^6$, $R^7$, or $R^8$, independently are hydrogen, halogen, or a hydrocarbyl having from 1 to about 20 carbon atoms, or a hydrocarbyl having from 1 to about 20 carbon atoms substituted at any hydrogen atom with an O, S, N, or Si, or a fluorinated hydrocarbyl having from 1 to about 20 carbon atoms wherein each carbon atom, independently, is substituted with 0, 1, 2, or 3 fluorine atoms; wherein $R^9$, $R^{10}$, $R^{11}$, or $R^{12}$ are independently selected from a hydrogen atom, a hydrocarbyl having from 1 to about 20 carbon atoms, and a hydrocarbyl having from 1 to about 20 carbon atoms substituted at any hydrogen atom, with O, S, N, or Si, and optionally contain an epoxy, hydroxyl, and/or carboxylic acid functional group; wherein Y is a fluorinated carbinol having from 1 to about 10 carbon atoms optionally protected by an acid labile group, X is OH, CN, $OC(O)R^{13}$, $C(O)OR^{13}$, $OR^{13}$, $N(R^{13})_2$, where $R^{13}$ is a linear or branched or cyclic aliphatic hydrocarbyl group containing 1 to about 12 carbons atoms and optionally at least one carbon atom of said hydrocarbyl contains 1, 2, or 3 fluorine atoms; and said oligomer having a weight average molecular weight (Mw) of less than about 3,000 as measured by Gel Permeation Chromatography.

2. A method of making the oligomers according to claim 1, comprising:
i) forming a monomer mixture consisting essentially of one or more monomers according to at least one monomer of Formulae A, B, and/or C and an ethylenically unsaturated material; and
ii) adding a catalyst containing a Ni or Pd complex, wherein the Ni complex comprises a hemilabile, chelating ligand containing a Group 15 and a Group 16 element capable of coordinating to the Ni complex, to the monomer mixture.

3. The method according to claim 2, wherein the monomers according to Formulae A, B, and C comprise monomers wherein groups $R^1$ through $R^{15}$ are selected from the group consisting of:
(a) H, $C_1$ to $C_{25}$ linear, branched, or cyclic alkyl, aryl, aralkyl, alkaryl, alkenyl and alkynyl;
(b) $C_1$ to $C_{25}$ linear, branched, or cyclic alkyl, aryl, aralkyl, alkaryl, alkenyl and alkynyl containing one or more hetero atoms selected from O, N, and Si and/or containing one or more halides;
(c) a group according to Formula (II):

$$-R^{16}-C(O)-W-R^{17} \qquad (II)$$

wherein $R^{16}$ is selected from a covalent bond, $C_1$ to $C_{25}$ linear, branched, or cyclic alkylene, arylene, aralkylene, alkarylene, alkenylene and alkynylene, which can optionally contain halides; W is selected from O, S, and $NR^{18}$, wherein $R^{18}$ is selected from H, and $C_1$ to $C_6$ linear, branched, or cyclic alkyl; and $R^{17}$ is selected from H, $C_1$ to $C_{25}$ linear, branched, or cyclic alkyl, aryl, aralkyl, alkaryl, alkenyl and alkynyl, which can optionally contain halides, and —OH, alkyl, aralkyl, and alkaryl terminated poly(alkyleneoxide) radicals; and
(d) a hydroxy alkyl ether according to Formula (III):

$$-A-O-[-(CR^{15}_2-)_q-O-]_p-(CR^{15}_2-)_q-OH \qquad (III)$$

wherein A is a linking group selected from $C_1$ to $C_6$ linear, branched, or cyclic alkylene, each occurrence of $R^{15}$ is independently selected from H, methyl, ethyl and a halide, q is from 1 to 5, and p is from 0 to 3.

4. The method according to claim 2, wherein the ethylenically unsaturated material is selected from the group consisting of ethylene, propylene, butylene, isobutylene, pentene, hexene, and combinations thereof.

5. Oligomers of polycyclic olefin monomers obtained from the method of claim 2.

* * * * *